US006239431B1

(12) United States Patent
Hilton et al.

(10) Patent No.: US 6,239,431 B1
(45) Date of Patent: May 29, 2001

(54) SUPERCONDUCTING TRANSITION-EDGE SENSOR WITH WEAK LINKS

(75) Inventors: Gene Hilton, Boulder; Kent David Irwin, Lyons; John Martinis, Boulder; David Wollman, Louisville, all of CO (US)

(73) Assignee: The United States of America as represented by the Secretary of Commerce, Washington, DC (US)

( * ) Notice: Subject to any disclaimer, the term of this patent is extended or adjusted under 35 U.S.C. 154(b) by 0 days.

(21) Appl. No.: 09/199,244

(22) Filed: Nov. 24, 1998

(51) Int. Cl.$^7$ .................................................. G01K 7/16
(52) U.S. Cl. ........................ 250/336.2; 257/34; 505/848
(58) Field of Search ........................... 250/336.2; 257/34; 505/848

(56) References Cited

U.S. PATENT DOCUMENTS

| | | | |
|---|---|---|---|
| 4,096,508 | 6/1978 | Fulton ....................................... 357/5 |
| 4,464,065 | * 8/1984 | Wolf et al. ............................. 374/121 |
| 4,521,682 | 6/1985 | Murakami et al. ...................... 250/211 |
| 4,578,691 | 3/1986 | Murakami et al. ...................... 357/5 |
| 4,831,421 | 5/1989 | Gallagher et al. ....................... 357/5 |
| 4,970,395 | 11/1990 | Kruse, Jr. ............................. 250/336.2 |
| 4,983,971 | 1/1991 | Przybysz et al. ..................... 341/133 |
| 5,019,721 | 5/1991 | Martens et al. ....................... 307/306 |
| 5,021,658 | 6/1991 | Bluzer ................................ 250/336.2 |
| 5,090,819 | * 2/1992 | Kapitulnik ............................. 374/176 |
| 5,126,315 | 6/1992 | Nishino et al. ......................... 505/1 |
| 5,179,072 | 1/1993 | Bluzer ................................... 505/1 |
| 5,219,826 | 6/1993 | Kapitulnik ............................. 505/1 |
| 5,331,162 | 7/1994 | Silver et al. ........................ 250/336.2 |
| 5,356,870 | 10/1994 | Fujiwara et al. ....................... 505/329 |
| 5,532,485 | 7/1996 | Bluzer et al. ....................... 250/336.2 |
| 5,552,375 | 9/1996 | Nishino et al. ......................... 505/330 |
| 5,571,778 | 11/1996 | Fujimoto et al. ....................... 505/329 |
| 5,610,510 | 3/1997 | Boone et al. ............................ 324/95 |
| 5,641,961 | 6/1997 | Irwin et al. ......................... 250/336.2 |
| 5,880,468 | * 3/1999 | Irwin et al. ......................... 250/336.2 |

OTHER PUBLICATIONS

Wollman, D.A.; Irwin, K.D.; Hilton, G.C.; Dulcie, L.L.; Martinis, J.M., "High–resolution, energy–dispersive micorcalorimeter spectrometer for x–ray microanalysis," *J. Microsacopy, vol. 188 (part 3)*, 196–223 (1997).

Skocpol, W.J.; Beasley, M.R.; Tinkham, M., "Phase–Slip Centers and Nonequlibrium Processes in Superconducting Tin Microbridges," *Journal of Low Temperature Physics*, vol. 16, 145–167 (1974).

Chimenti, D.E.; Watson, H.L.; Huebener, R.P., "Current–Induced Breakdown of Superconductivity in Constricted Type I Superconducting Films", *Journal of Low Temperature Physics*, vol. 23, 303–318 (1976).

* cited by examiner

Primary Examiner—Constantine Hannaher
(74) Attorney, Agent, or Firm—Law Offices of Rick Martin

(57) ABSTRACT

A system and method for using one or more localized weak-link structures, and damping on the electrical bias circuit, to improve the performance of superconducting transition-edge sensors (TES). The weak links generally consist of an area or areas having a reduction in cross-sectional geometry in an otherwise uniform bilayer TES applied to a substrate. The weak links control the dissipation of power in the sensor, making it quieter and making its electrical response smoother and less hysteretic. The TES response is also made smoother by implementing a damping circuit on the electrical output of the TES.

40 Claims, 15 Drawing Sheets

SUPERCONDUCTING TRANSITION-EDGE SENSOR WITH WEAK LINKS

FIELD OF THE INVENTION

This invention relates to superconducting transition-edge sensors, and more particularly to those having weak links.

BACKGROUND OF THE INVENTION

The accurate detection of particles, including photons, molecules, electrons, ions and phonons, is essential to many industrial and research measurements. X-ray microcalorimeters convert the x-ray energy into heat in the form of hot-electrons or phonons. An x-ray microcalorimeter consists of an absorber to stop and thermalize incident x-rays and a thermometer to measure the resulting temperature rise. The first x-ray microcalorimeters used insulating or superconducting absorbers (for low heat capacity) and a semiconductor thermistor thermometer. While these achieve adequate energy resolution (7.1 eV FWHM at 6 keV), the response time is intrinsically slow. A known X-ray microcalorimeter uses a normal-metal absorber and a NIS tunnel junction to measure the temperature rise. The response is fast, but the best achieved energy resolution is 18 eV FWHM at 6 keV.

Superconducting transition-edge sensors have been proposed for use as a thermometer within an x-ray microcalorimeter. The temperature of a superconducting film is held within the superconducting transition, and heat deposited in the film is measured via the strong temperature dependence of the film's electrical resistance in this region. For x-ray detection the optimum transition temperature is between about 50 and 150 mK. The choice of the $T_c$ within this range depends on the desired detector parameters. Superconducting tungsten films having $T_c=70$ mK have been used for x-ray detection. For an elemental superconductor such as tungsten, the transition temperature tends to be a fixed property of the metal and is difficult to tune to suit specific applications. For alloys of superconductors with normal metals, the $T_c$ can be adjusted, but the transition edge is not sharp, and the alloys are not stable. The transition temperature can also be adjusted via the proximity effect in superconductor/normal-metal bilayers. When a clean interface is made between a superconducting film and a normal-metal film, and the films are thinner than the relevant coherence lengths, the bilayer acts as a single superconducting film with a transition temperature suppressed from that of the bare superconductor. By varying the relative film thickness, the $T_c$ of the bilayer can be adjusted. Iridium/gold bilayers have been described for particle detection. The $T_c$ of elemental iridium is 112 mK, which is within the target range for x-ray detection. However, the Ir/Au system is very difficult to reproducibly fabricate. It requires the substrate to be heated, it requires a very clean, high vacuum deposition system, and the transition temperature of such bilayers is limited to less than 112 mK. Other bilayer systems have been developed using an aluminum/normal-metal bilayer that have a larger tunable transition range, that are more easily deposited, that are deposited without heating the substrate, that are deposited in a deposition system with only moderate vacuum (~1e−7 torr, ~1e−7 millimeter mercury, to ~0.019336 pound force per square inch, ~−931 Pa), that are more reliably reproducible, and that are sharper superconducting transitions. Aluminum/normal-metal bilayers have been used as TES's since they have reproducible transition temperatures. The $T_c$ can be reduced by more than an order of magnitude, the $T_c$ is tunable in a predictable fashion as a function of the thicknesses of the individual layers, and the transition edge is extremely sharp.

During operation the TES is maintained within the transition region by electrothermal feedback (ETF). The transition from the superconducting to the normal state is measured to determine the energy deposited in the system by particles. The bilayer resistance can be monitored by voltage biasing the bilayer and measuring the current through the bilayer, for example with a superconducting quantum interference device (SQUID). The increase in bilayer resistance with temperature leads to a reduction in measured current. With an ETF-TES the energy deposited in the bilayer is approximately the integral of the reduction in feedback Joule heating, or the bias voltage multiplied by the integral of the change in measured current. Alternatively the bilayer resistance can be monitored by current biasing and measuring the voltage across the bilayer with a FET. There is a continuum of biasing conditions between voltage biasing and current biasing which can be used in the measurement. The superconducting transition can also be measured, for instance, via the change in the self or mutual magnetic inductance of a coil or coils placed around the bilayer, or by a kinetic inductance measurement.

Representative of the art is:

U.S. Pat. No. 5,641,961 (1997) to Irwin et al. discloses a superconducting transition edge detector using electrothermal feedback. The sensor comprises a primary heat sink such as a substrate, a variable resistor made of a superconducting material deposited on the substrate, and a current sensing means such as a SQUID array for measuring the current through the variable resistor. The resistor is voltage biased, and the bias voltage is chosen such that the resistor is maintained within its superconducting transition region by electrothermal feedback.

U.S. Pat. No. 5,610,510 (1997) to Boone et al. discloses a that granular film [multiple Josephson junction] detectors display nonbolometric behavior which is presumably caused by weak links. Boone further discloses that a nonbolometric mechanism may be a better means of making a detector, particularly for microwave frequencies.

U.S. Pat. No. 5,571,778 (1996) to Fujimoto et al. discloses a superconductor junction material which comprises a substrate of a single crystal, and at least one flux flow element, and optionally at least one Josephson junction element, provided on the surface, each of the flux flow and Josephson junction elements being formed of a superconducting oxide layer having a weak link.

U.S. Pat. No. 5,552,375 (1996) to Nishino et al. discloses a method of forming superconducting devices including a type having a structure of a superconductor—a normal conductor (or a semiconductor)—a superconductor, and a type having a superconducting weak-link portion between superconductors.

U.S. Pat. No. 5,532,485 (1996) to Bluzer et al. discloses a multispectral superconductive quantum detector. Each quantum detector is connected to a read-out loop [SQUID] which includes superconductive material that defines a path. The SQUID read out of the superconductive quantum detector is using a direct coupled approach. A SQUID bias current $I_{SQ}$ is needed to cause the SQUID to maintain proper operation of the SQUID in the voltage state.

U.S. Pat. No. 5,356,870 (1994) to Fujiwara et al. discloses an ion beam irradiated to an oxide superconducting thin film formed on a substrate to disturb the crystal structure of the superconducting thin film and thus forming a damaged layer.

U.S. Pat. No. 5,331,162 (1994) to Silver et al. discloses a sensitive, low-noise, superconductive infrared photo detector. Each detector element includes a thin granular film of superconducting material which forms a randomly-connected array of weakly coupled superconductors. The weakly coupled superconductors promote the formation of oppositely polarized fluxons which are driven toward opposite sides of the film when subjected to the bias current. The detector array is connected to a current source, and a SQUID read-out circuit.

U.S. Pat. No. 5,219,826 (1993) to Kapitulnik discloses a superconducting Josephson junction created in high $T_c$ superconducting film with a bridge connecting two superconducting banks by subjecting the bridge to a tunneling electron current from a sharp electrode close to the bridge.

U.S. Pat. No. 5,179,072 (1993) to Bluzer discloses a multispectral superconductive quantum radiant energy detector and related method utilizing a closed loop of superconductive material having spaced legs, one of which is disposed to ambient.

U.S. Pat. No. 5,126,315 (1992) to Nishino et al. discloses a superconducting device including a type having a structure of a superconductor—a normal conductor (or a semiconductor)—a superconductor, and a type having a superconducting weak-link portion between superconductors.

U.S. Pat. No. 5,021,658 (1991) to Bluzer discloses a superconducting infrared detector. The detector is also connected to a SQUID amplifier. The SQUID amplifier is connected to a bias current source so that its output voltage is a function of the flux coupled to the SQUID. The electrical connections disclosed in this patent are analogous to the described invention.

U.S. Pat. No. 5,019,721 (1991) to Martens et al. discloses active superconducting devices formed of thin films of superconductor which include a main conduction channel which has an active weak link region.

U.S. Pat. No. 4,983,971 (1991) to Przybysz et al. discloses a superconducting analog-to digital converter for producing a digital output signal which is a function of an analog input signal.

U.S. Pat. No. 4,970,395 (1990) to Kruse, Jr. discloses a phonon detector based upon phonon-assisted tunneling in superconductor-insulator-superconductor or super-Schottky structures in which the superconductor is a high-transition temperature superconductor.

U.S. Pat. No. 4,831,421 (1989) to Gallagher et al. discloses a switch that introduces quasiparticles at an asymmetric location into a reduced cross-sectional area microbridge link that is part of an output path.

U.S. Pat. No. 4,578,691 (1986) to Murakami et al. discloses a photodetecting device having Josephson junctions, comprising an insulating substrate, a polycrystalline superconductor film formed on the insulating substrate such that Josephson junctions are formed at grain boundaries.

U.S. Pat. No. 4,521,682 (1985) to Murakami et al. discloses a photodetecting device having Josephson junctions, comprising an insulating substrate, a polycrystalline superconductor film formed on the insulating substrate such that Josephson junction are formed at grain boundaries.

U.S. Pat. No. 4,096,508 (1978) to Fulton discloses a supercurrent memory device comprising a plurality of extended Josephson junctions coupled to one another by having their weak-link layers in contact.

K. D. Irwin, G. C. Hilton, D. A., Wollman, J. M. Martinis, "X-ray detection using a superconducting transition edge sensor microcalorimeter with electrothermal feedback", Appl.Phy.Lett.69, 1945 (1996).

K. D. Irwin, G. C Hilton, J. M. Martinis, B. Cabrera, "A hot electron calorimeter for x-ray detection using a superconducting transition edge sensor with electrothermal feedback", Nucl.Inst.and Meth.A 370, 177–179 (1996).

D. A. Wollman, K. D. Irwin, G. C. Hilton, L. L. Dulcie, J. M. Martinis, "High-resolution, energy dispersive microcalorimeter spectrometer for x-ray microanalysis", J.Microscopy, vol 188 (part 3), 196–223 (1997).

W. J. Skocpol, M. R. Beasley, M. Tinkham, "Phase Slip Centers and Nonequilibrium Processes in Superconducting Tin Microbridges," Journ. of Low Temp. Physics 16, 145–167 (1974).

D. E. Chimenti, H. L. Watson, R. P. Huebener, "Current-Induced Breakdown of Superconductivity in Constricted Type I Superconducting Films, "Journ. of Low Temp. Physics. 23, 303–318 (1976).

The foregoing TES's are deficient from the disclosed invention in a number of ways. The deficiencies are satisfied by the present invention. What is provided is a TES having a weak link to reduce noise due to phase slip line motion and irreproducibility. What is provided is a TES having a step edge weak link. What is provided is a TES having a thinned weak link. What is provided is a TES having a perforated weak link. What is provided is a TES having a reduced $T_c$ weak link. What is provided is a TES having impurity weak links. What is provided is a TES having multiple weak links.

SUMMARY OF THE INVENTION

The primary aspect of the present invention is to provide a weak link in a TES.

Another aspect of the present invention is to provide a TES having a weak link to reduce noise due to phase slip line motion and irreproducibility.

Another aspect of the present invention is to provide a TES having a weak link with less electrical noise.

Another aspect of the present invention is to provide a TES having a weak link to give a non-hysteretic electrical response.

Another aspect of the present invention is to provide a TES having a weak link to give a smoother electrical response.

Another aspect of the present invention is to provide a step edge weak link in a TES.

Another aspect of the present invention is to provide a thinned TES weak link in a TES.

Another aspect of the present invention is to provide a perforated weak link in a TES.

Another aspect of the present invention is to provide a reduced $T_c$ weak link in a TES.

Another aspect of the present invention is to provide an impurity seam weak link in a TES.

Another aspect of the present invention is to provide a plurality of weak links in a TES.

Other objects of this invention will appear from the following description and appended claims, reference being made to the accompanying drawings forming a part of this specification wherein like reference characters designate corresponding parts in the several views.

The physics of superconducting films with weak links has been previously studied, however, the use of weak links in transition-edge sensors (TES) has not been pursued since the weak links lead to a reduction in critical current, $I_c$. The critical current is an important parameter for a superconducting transition-edge sensor. The higher the critical current, the faster the TES can be made to operate. Although weak links reduce the critical current, the other beneficial effects of weak links (smoother, quieter, non-hysteretic response) significantly compensate for the small degradation in performance from the reduction in critical current.

The instant invention is an improvement of the prior art TES comprising a TES with localized weak-link structures and damping of the electrical bias circuit. These are used to control the response function of the TES by removing glitches and steps in the output. The weak links also make the electrical characteristics of the TES output quiet and non-hysteretic.

This invention utilizes a superconductor/normal-metal bilayer transition-edge sensor having a weak link. The TES is maintained in the transition region where its properties are extremely sensitive to temperature. In the detector, the energy of an absorbed particle is converted to heat by the absorber, and the transition from the bilayer's superconducting to normal state is used to sense the temperature rise. The transition temperature, $T_c$, of the bilayer can be reproducibly controlled as a function of the relative thicknesses and the total thickness of the superconducting and normal-metal layers. The range of available $T_c$'s extends from below 50 mK to above 1.0 K, allowing the detector to be tailored to the application. For x-ray detection the preferred $T_c$ is about 50–150 mK. The width of the transition edge can be less than 0.1 mK, which allows very high detector sensitivity.

The TES is fabricated having a bilayer with a superconducting transition-edge near 100 mK. The weak links are incorporated into the TES during the fabrication of the TES. One embodiment comprises a TES having a step edge weak link. The step edge weak link is created by first etching a step into the substrate. Then the TES is applied over the substrate, which creates a step edge in the TES bilayer. The reduction in the cross-sectional area of the TES at the step edge gives the desired reduction in the critical current. The reduction in the critical current is achieved by all of the described embodiments. In another embodiment, a thinned TES weak link is created by localized reduction in the thickness of the superconducting layer of the TES. This may be accomplished by using a notch in the superconducting layer. In yet another embodiment, a weak link may be created by completely or partially perforating the TES. In yet another embodiment, a weak link may be created by reduction of $T_c$ in the superconducting film. This is accomplished by deposition of a normal metal line above or below the TES, with the reduction in $T_c$ occurring by the proximity effect. In yet another embodiment, a weak link may be created by incorporating impurities in the superconducting layer resulting in a reduction in the critical current. In yet another embodiment, multiple weak links may be created by including in a single TES a plurality of any of the foregoing weak link structures.

A voltage is applied across the sensor, and the resulting current is measured using a current amplifier such as a SQUID. The current that flows through the film is a function of the applied voltage and the temperature. The current response of the sensor to the voltage and temperature without the weak links could be varied and would otherwise have steps and glitches, extra noise, and hysteretic.

Prior to the present invention it was necessary to apply a magnetic field to the TES to eliminate noise due to phase slip lines. The present invention utilizing weak links eliminates the need to apply the magnetic field.

Further improvement in the smoothness of the response of transition-edge sensors can be achieved by the use of a damping circuit on the electrical output. Whenever the Josephson effect occurs in the transition-edge sensor, high-frequency resonances in the bias circuit can interact with the Josephson oscillations to produce steps in the electrical response of the TES. The present invention incorporates damping schemes for the electrical bias circuit which prevents high-frequency oscillations from entering the TES, thereby removing these voltage steps, and leading to a smoother detector electrical response.

The fabrication of localized weak links, and the implementation of a damping scheme on the bias circuit of a transition-edge sensor, are important improvements in x-ray detectors, as they improve the detector performance. They eliminate step like structures in the I-V characteristics caused by ac Josephson effect, thereby resulting in smoother I–V characteristics which makes operation significantly simpler.

The detector can be used with many types of particles, including photons, molecules, electrons, ions and phonons. In the preferred embodiment the particles are x-ray photons. Depending on the type of particle, the absorber can be a normal metal, a superconductor, semiconductor, an insulator, the bilayer substrate, or the bilayer itself. In the preferred embodiment it is a normal metal. The bilayer normal metal can be any metal which is a normal conductor at the operating temperature.

Before explaining the disclosed embodiment of the present invention in detail, it is to be understood that the invention is not limited in its application to the details of the particular arrangements shown, since the invention is capable of other embodiments. Also, the terminology used herein is for the purpose of description and not of limitation.

DETAILED DESCRIPTION OF THE PREFERRED EMBODIMENT

Figure 1:
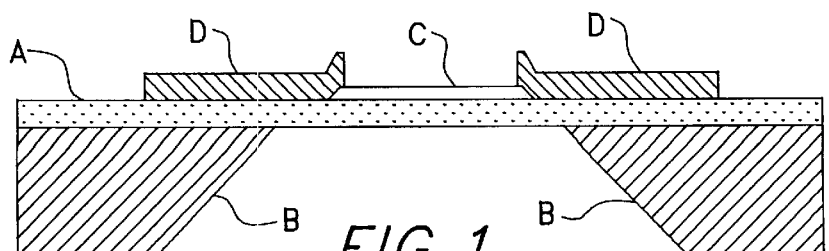
FIG. 1 is a side plan view of the prior art.

FIG. 1 is a side plan view of the Prior Art. Membrane film A is deposited on substrate B. The membrane film A provides thermal isolation. Transition edge sensor (TES) C is deposited on membrane film A. TES C may consist of a single superconducting material or of a bilayer comprising a normal-metal layer and a superconducting layer. Superconducting contacts D are applied to the TES C. The structure of TES C with a single superconductor is illustrated in FIG. 1. In the bilayer version shown in FIG. 3, the TES comprises a normal-conductor layer N and an aluminum layer L. The substrate is preferably a material which is not a source of impurities. In one version, the substrate B is crystalline silicon coated with a $SiN_x$ layer. In another version the substrate B is an $SiN_x$ membrane having low thermal conductivity. The substrate can also serve as a substrate for an absorber and for measurement circuit connections. In the bilayer version, the normal-metal layer is made of any metal or metal alloy which is a normal conductor at the operating temperature of the sensor. Preferred normal metals include gold, silver, copper, palladium, platinum, and alloys of these metals; gold/copper alloys and palladium/gold alloys. The normal metal can be a material such as tungsten which is a superconductor having a $T_c$ below the operating temperature of the sensor, but is a normal conductor at the operating temperature.

Figure 2:
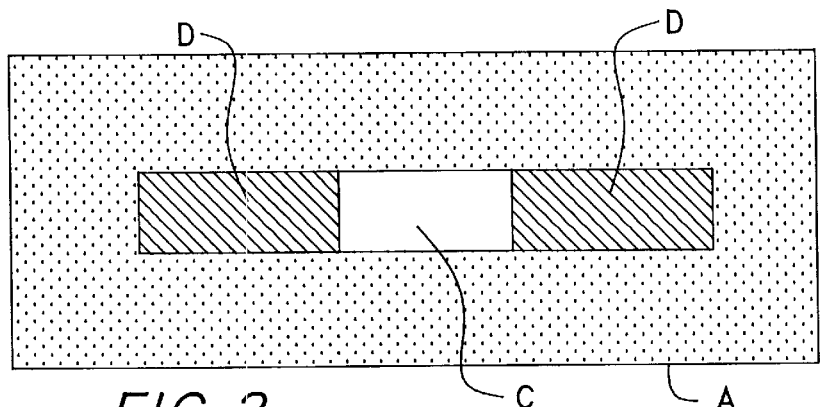
FIG. 2 is a top plan view of the prior art.

FIG. 2 is a top plan view of the Prior Art as previously described in FIG. 1 depicting the single layer TES.

Figure 3:
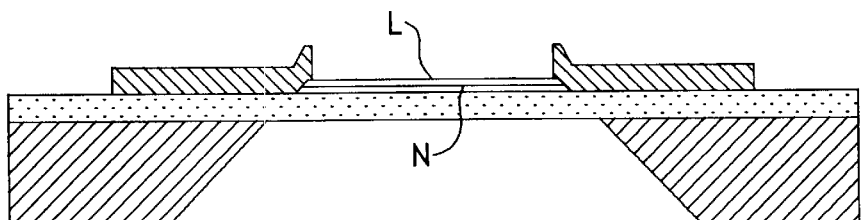
FIG. 3 is a side plan view of the bilayer TES prior art.
Figure 4:
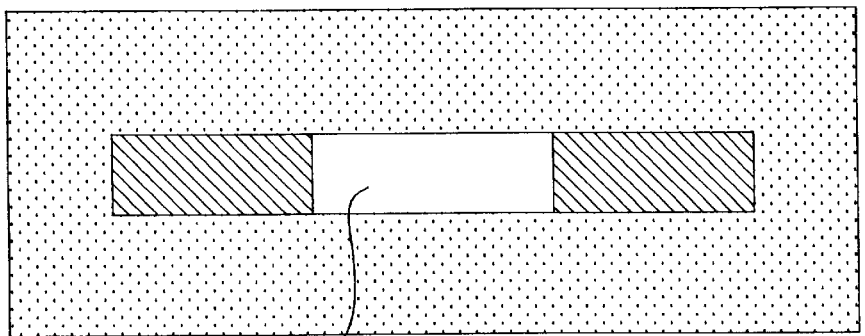
FIG. 4 is a top plan view of the bilayer TES prior art.

FIG. 4 is a top plan view of the Prior Art as shown in FIG. 3 depicting the bilayer TES.

A number of different localized weak links are disclosed herein to improve the electrical performance of a transition-edge sensor (TES). The preferred embodiment uses a weak link consisting of a step edge in the substrate on which the TES is deposited.

Figure 5:
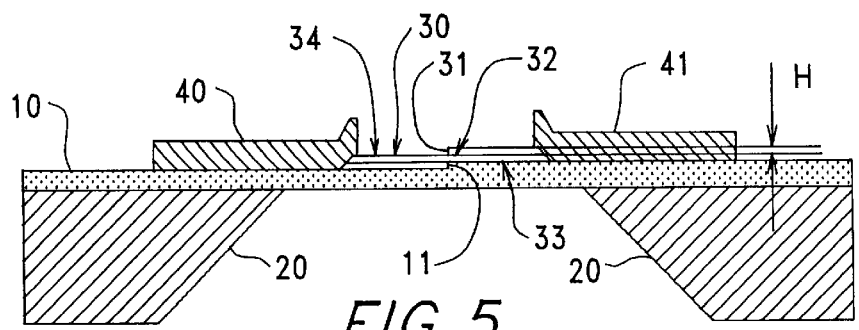
FIG. 5 is a side plan view of a TES with a bilayer step edge weak link.

Referring to FIG. 5, the preferred embodiment, the step edge 11 is introduced into the membrane film 10 by photolithographic etching. Membrane film 10 is deposited on substrate 20. This is well known in the art. The TES bilayer 30 is then deposited over the substrate step edge 11 creating step edge 31 in the bilayer of height "H". The bilayer consists of normal layer 33 and superconducting layer 34 whose thicknesses are chosen to achieve the desired superconducting transition temperature. Depending upon the particular materials chosen for each layer, the arrangement of the layers on the substrate can be reversed. For example, superconducting aluminum can be placed on top of or below the normal metal layer, such as silver. The step in the bilayer results in a reduction in thickness H, resulting in turn in a reduced cross-sectional area 32 as compared to the thickness and cross-sectional area of the bilayer 30. The reduced cross-sectional area 32 results in a reduction in the critical current, $I_c$, of the TES in the region of the step edge 11, thereby forming a weak link. The step edge 11 should be of such a size so as to reduce the critical current of the TES, $I_c$, by 10% to 90% of the "bulk" TES value, which is predicted, for example, by the Ginzberg-Landau theory. The step edge height necessary to achieve the desired critical current reduction varies with the steepness of the step edge. For vertical step edges, 90 degrees from the horizontal, a step edge height of 10% to 90% of the TES thickness is necessary. As the step edge angle is reduced the step edge height needs to be increased to cause the necessary cross-section reduction. The TES is connected to the rest of the circuit with superconducting contacts 40 and 41. These are typically depicted in all relevant figures.

Figure 6:
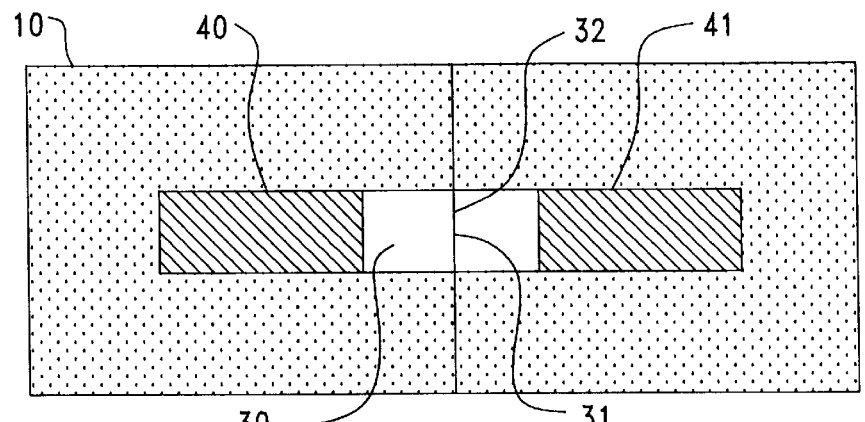
FIG. 6 is a top plan view of a TES with a bilayer step edge weak link.

FIG. 6 is a top plan view of a bilayer TES with a step edge weak link 32, as described in FIG. 5.

Figure 7:
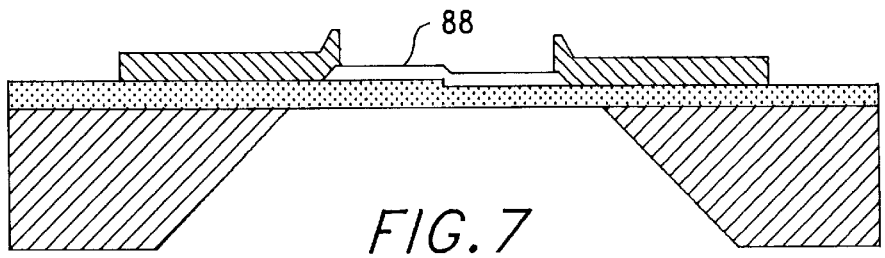
FIG. 7 is a side view of the single layer step edge embodiment.

FIG. 7 is a side view of the single layer step edge embodiment. The features are as described in FIG. 5 with the exception that the bilayer 30 in FIG. 5 is replaced by a single layer comprising a superconducting layer 88.

Figure 8:
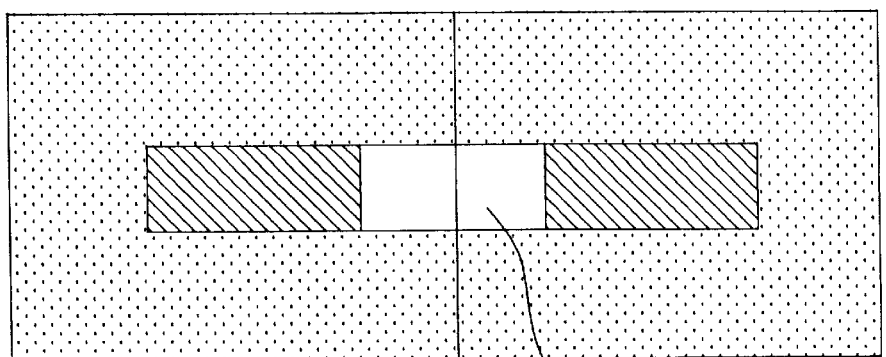
FIG. 8 is a top plan view of the single layer step edge embodiment.

FIG. 8 is a top plan view of the single step edge embodiment depicted in FIG. 7.

Figure 9:
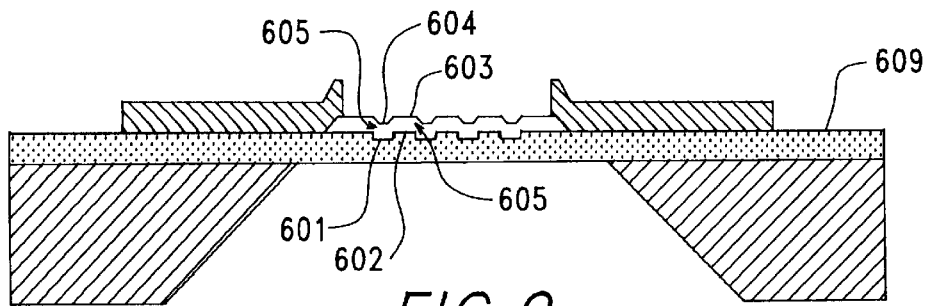
FIG. 9 is a side plan view of a TES with a single layer multi-step edge weak link.

FIG. 9 is a side plan view of a TES with a single layer multi-step edge weak link. Multiple steps as described in FIG. 9 are fabricated into superconducting layer 603. Steps 602 in the membrane 609 result in areas of reduced cross-sectional area 605 in superconducting layer 603. The steps may be fabricated by photolithographic etching. The number of step edge weak links chosen may be sufficient to fill a portion of the TES or the entire length of the TES.

For example:

In the case of a bilayer detector without an absorber, a square detector that is on the order of 400 μm on a side is specified. In order to minimize thermal diffusion times in the TES, a TES thickness of 300 nm is chosen. The selected operating temperature is 100 mK. In order to obtain this operating temperature, the TES is fabricated from roughly 100 nm of Al and 200 nm of Ag. The heat capacity of the detector is the roughly 0.3 pJ/K. With proper bias, this allows a 6 keV saturation energy. If the detector is biased at 0.99 $T_c$, then $\lambda_Q$, the charge imbalance relaxation length, for this bilayer is on the order of 30 μm. The quantity, $\lambda_Q$, is known in the art. The multiple step edge weak links are then spaced at twice $\lambda_Q$ or 60 μm. The weak links are spaced between 0.3 and 10 times $\lambda_Q$, which is a material dependent parameter. This gives a result of six step edge weak links within the given size TES.

Figure 10:
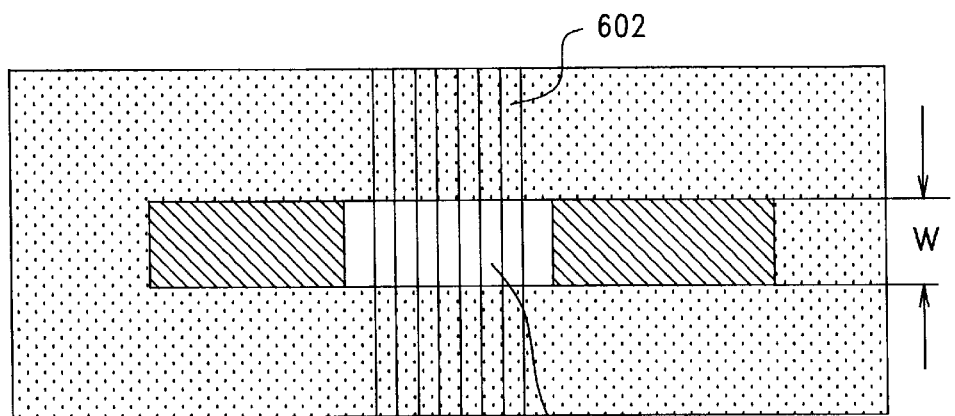
FIG. 10 is a top plan view of a TES with a single layer multi-step edge weak link.

FIG. 10 is a top plan view of a TES with a single layer multi-step edge weak link. Steps 602 completely span the width W of superconducting layer 603. Although FIG. 10 depicts eight steps, this is not offered as a limitation as any number of steps may be used according to the needs of an operator.

Figure 11:
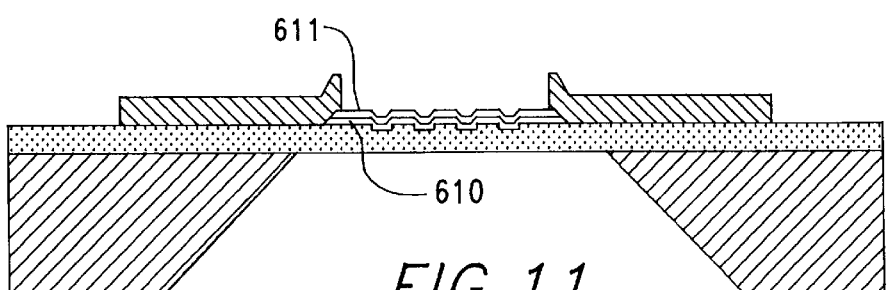
FIG. 11 is a side plan view of the bilayer multi-step edge weak link.

FIG. 11 is a side plan view of the bilayer multi-step edge weak link. The features are as described in FIG. 9 with the exception that the single superconducting layer 603 in FIG. 9 is replaced by a bilayer comprising a normal metal layer 610 and a superconducting layer 611.

Figure 12:
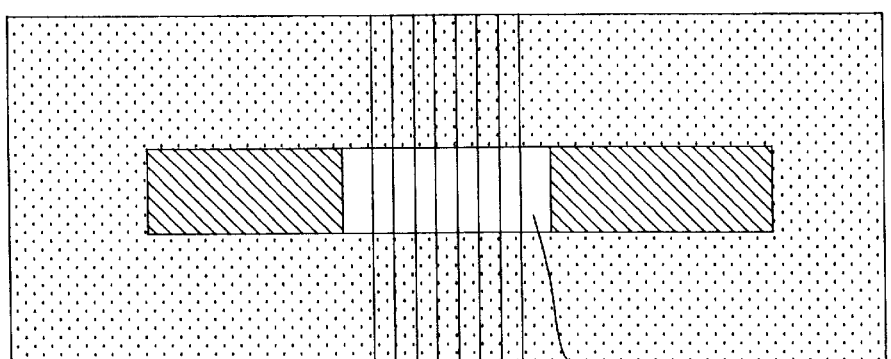
FIG. 12 is a top plan view of the bilayer multi-step edge weak link.

FIG. 12 is a top plan view of the bilayer multiple step edge weak link depicted in FIG. 11.

Figure 13:
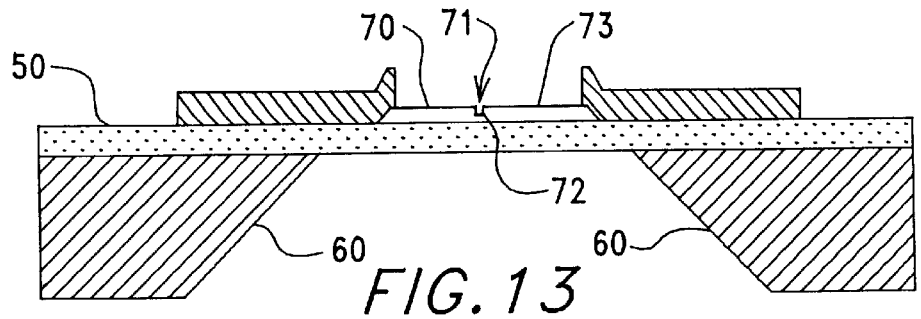
FIG. 13 is a side plan view of a TES with a notch weak link.

FIG. 13 is a side plan view of a TES with a notch weak link. In an alternate embodiment a weak link is created by a localized thinning or narrowing of the TES 70 thereby creating a notch. The thinning involves localized reduction of the superconducting layer 73 of the bilayer TES 70. The thinning of the superconducting layer 73 of TES 70 may be accomplished in many ways, for example, through the use of a notch 71 fabricated by photolithographic means. This results in reduced cross-sectional area of the thinned region 72 of the TES 70 as compared to the thickness of the unthinned superconducting layer. Due to the area of reduced cross-section, the local critical current of the thinned region 72 is decreased, thereby forming the weak link. The thinning the bilayer TES can tolerate is in the range of 1% to 100% while still functioning as required. Membrane 50 is deposited upon substrate 60.

Figure 14:
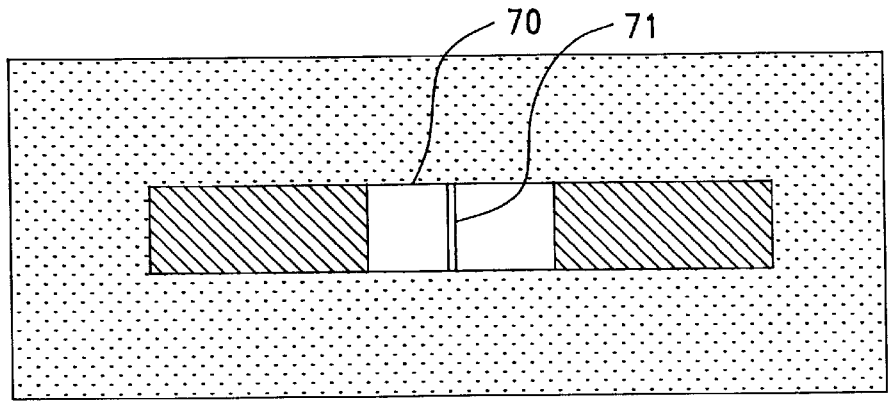
FIG. 14 is a top plan view of a TES with a notch weak link.

FIG. 14 depicts a top plan view of the TES 70 with the notch 71 and with a thinned region weak link 72 depicted in FIG. 13.

Figure 15:
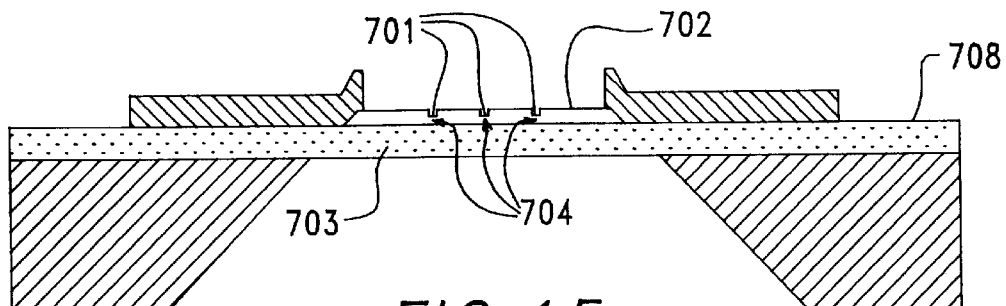
FIG. 15 is a side plan view of the multiple notch embodiment.

FIG. 15 is a side plan view of the multiple notch embodiment. Superconducting layer 702 is mounted to substrate 708. Notches 701 are etched into superconducting layer 702 resulting in reduced area 704 beneath each notch. The reduced areas 704 need not be of identical cross-sectional area. Further, the number of notches can be of any number depending upon the needs of a user.

Figure 16:
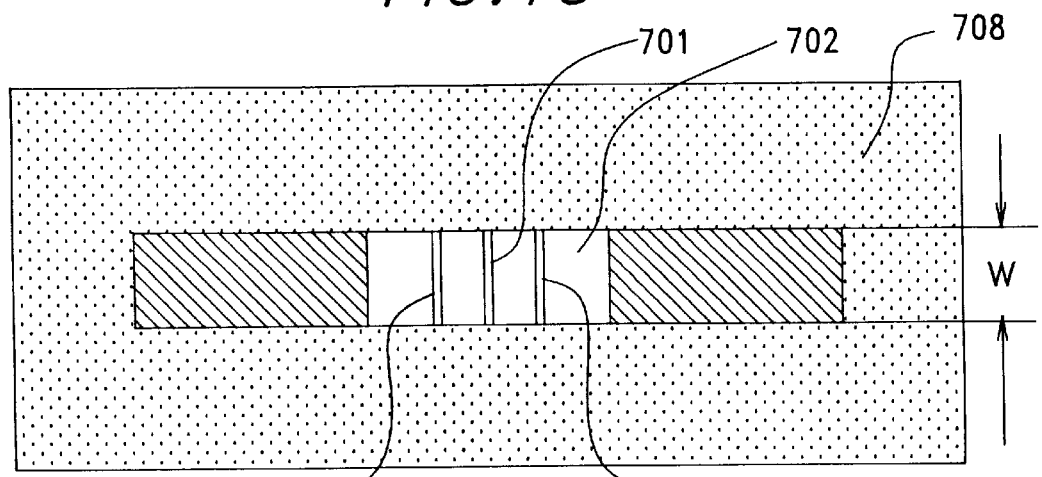
FIG. 16 is a top plan view of the multiple notch embodiment.

FIG. 16 is a top plan view of the multiple notch embodiment. Superconducting layer 702 is mounted to substrate 708. Notches 701 are etched into superconducting layer 702 resulting in reduced area 704 beneath each notch. Notches 701 span the entire width W of the superconducting layer 702.

Figure 17:
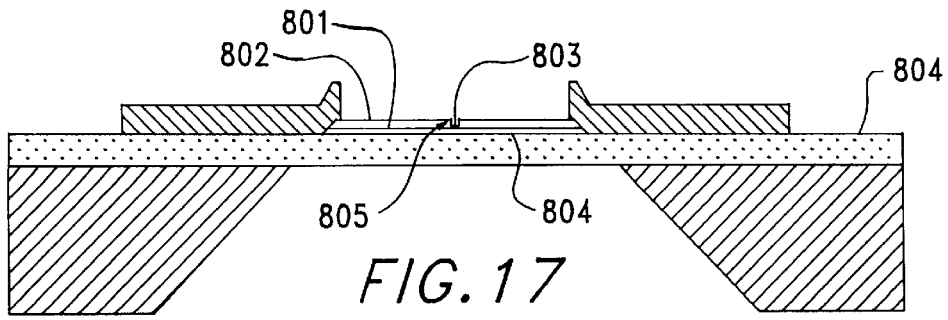
FIG. 17 is a side plan view of a notched bilayer embodiment.

FIG. 17 is a side plan view of a notched bilayer embodiment. Normal metal layer 801 and superconducting layer 802 are mounted to substrate 804. Notch 803 is etched into layer 802 using photolithographic methods known in the art. Notch 803 may or may not completely bifurcate penetrated layer 802, thereby leaving a section of reduced area 805 and thus reduced transition temperature in the TES.

Figure 18:
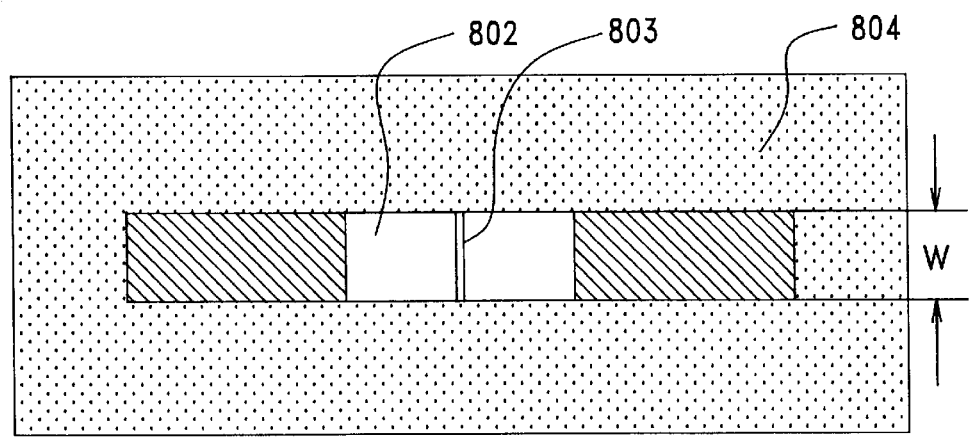
FIG. 18 is a top plan view of an notched bilayer embodiment.

FIG. 18 is a top plan view of a notched bilayer embodiment. Normal metal layer 801 and superconducting layer 802 are mounted to substrate 804. Notch 803 is etched into layer 802 spanning the entire width W of layer 802.

Figure 19:
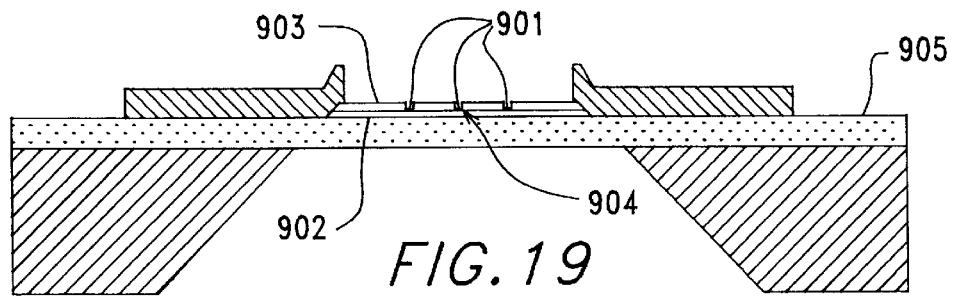
FIG. 19 is a side plan view of a multiple notched bilayer embodiment.

FIG. 19 is a side plan view of a multiple notched bilayer embodiment. Normal metal layer 902 and superconducting layer 903 are mounted to substrate 905. Notches 901 are etched into layer 903. Notches 901 may or may not completely bifurcate penetrated layer 903, thereby leaving a sections of reduced area 904 in layer 903. Further, the number of notches can be of any number depending upon the needs of a user.

Figure 20:
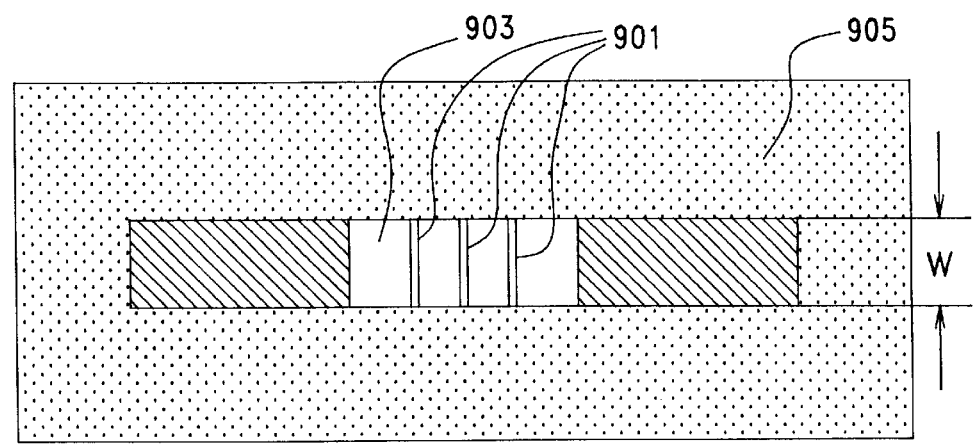
FIG. 20 is a top plan view of a multiple notched bilayer embodiment.

FIG. 20 is a top plan view of a multiple notched bilayer embodiment. Superconducting layer 903 and normal-metal layer 902 are mounted to substrate 905. Notches 901 are etched into layer 903. Notches 901 completely span the width W of layer 903.

Figure 21:
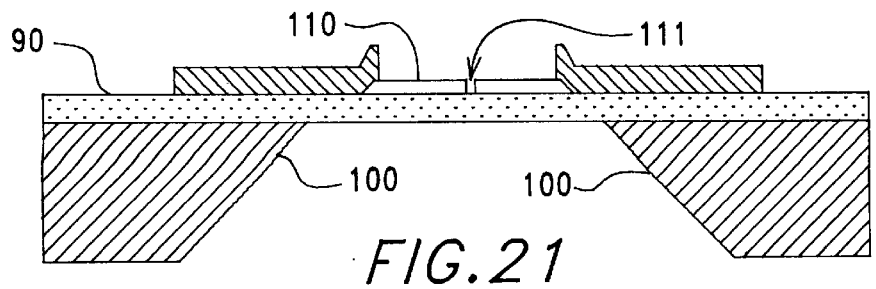
FIG. 21 is a side plan view of a TES with a single layer perforated weak link.

FIG. 21 is a side plan view of a TES with a single layer perforated weak link. In this alternate embodiment a weak link is created by the fabrication of a series of holes in the superconducting layer 110. Perforations 111 may consist of complete penetration of the layer 110 or partial penetration. Complete perforation causes a reduction in the cross-sectional area corresponding to the width of the perforations. Complete or partial perforation results in weak link(s) being created in the TES. Membrane 90 is mounted upon substrate 100.

Figure 22:
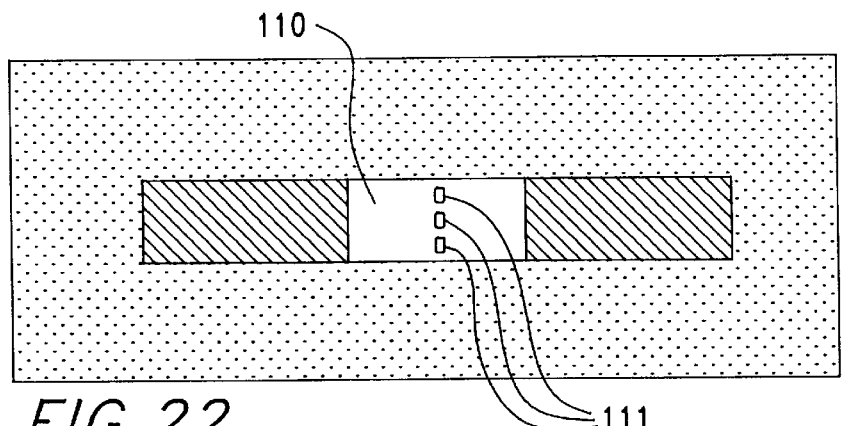
FIG. 22 is a top plan view of a TES with a single layer perforated weak link.

FIG. 22 is a top plan view of a TES with single layer weak link perforations 111. Even though FIG. 22 depicts a row of perforations 111, any pattern of arrangement of the perforations is acceptable and will result in the desired characteristics for the invention.

Figure 23:
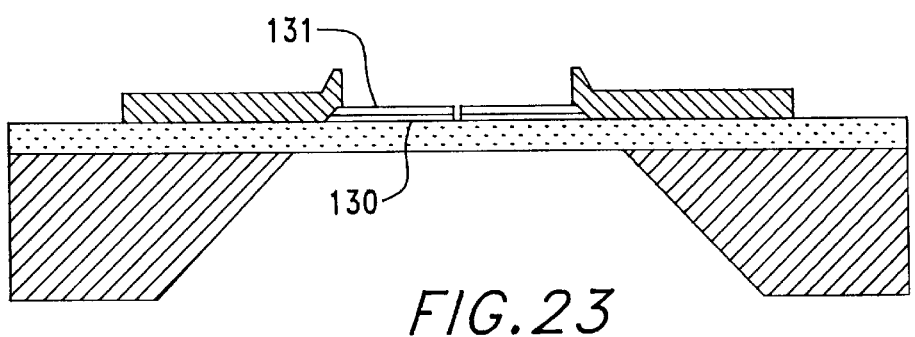
FIG. 23 is a side plan view of a bilayer TES with a bilayer perforated weak link.

FIG. 23 is a side plan view of a bilayer TES with a perforated weak link. The features are as described in FIG. 21 with the exception that the single superconducting layer 110 in FIG. 21 is replaced by a bilayer comprising a normal metal layer 130 and a superconducting layer 131.

Figure 24:
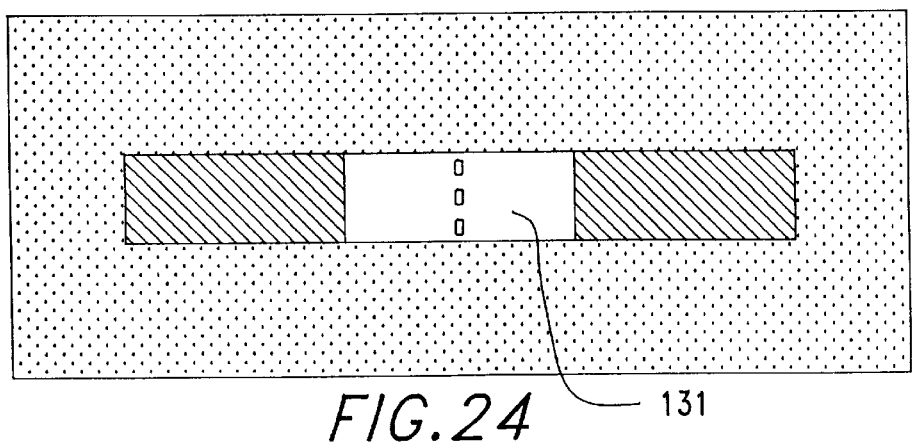
FIG. 24 is a top plan view of a bilayer TES with a bilayer perforated weak link.

FIG. 24 is a top plan view of a bilayer TES with a perforated weak link depicted in FIG. 23.

Figure 25:
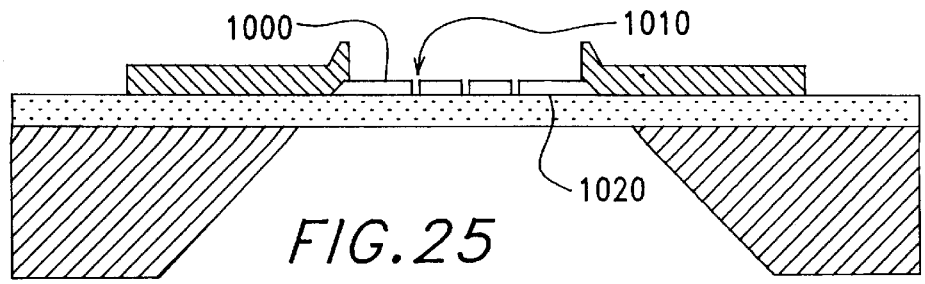
FIG. 25 is a side plan view of a multiple perforation embodiment.

FIG. 25 is a side plan view of a multiple perforation embodiment. Perforations 1010 completely penetrate superconducting layer 1000. The perforations result in areas of reduced cross section 1030 between each perforation. Perforations 1010 may be fabricated in any pattern, symmetrically or asymmetrically, using photolithographic methods known in the art. The depiction shown in FIG. 26 is representative of a possible perforation arrangement.

Figure 26:
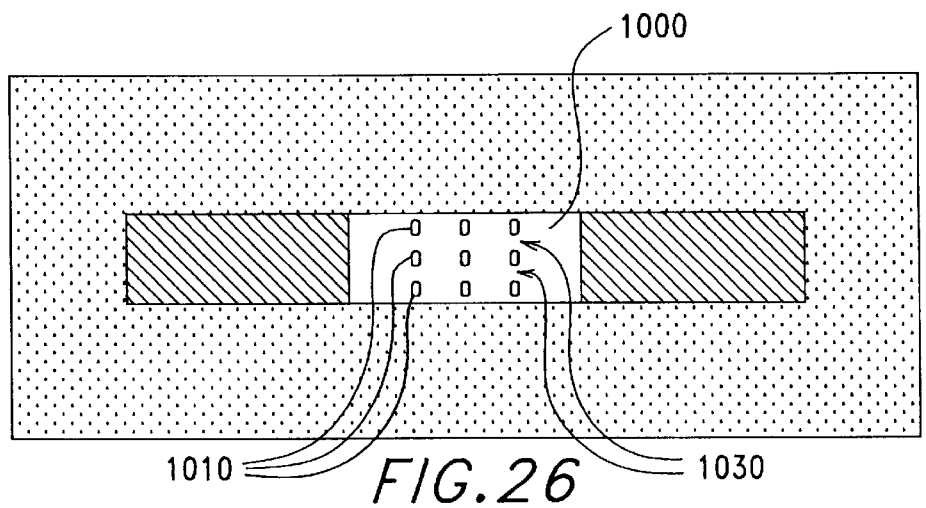
FIG. 26 is a top plan view of a multiple perforation embodiment.

FIG. 26 is a top plan view of a multiple perforation embodiment. Perforations 1010 completely penetrate superconducting layer 1000. Perforations 1010 may occur in any pattern, symmetrically or asymmetrically. The depiction shown in FIG. 26 is representative of a possible perforation arrangement. The arrangement of the perforations 1010 result in sections of reduced area 1030. The form of the sections of reduced area are a function of the arrangement of the perforations.

Figure 27:
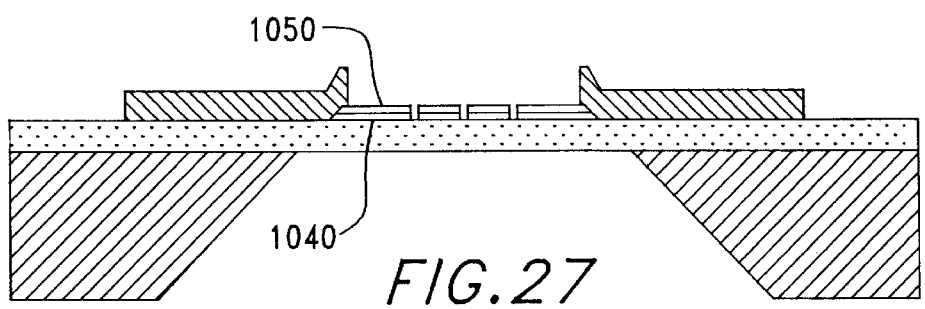
FIG. 27 is a side plan view of the bilayer multiple perforation embodiment.

FIG. 27 is a side plan view of the bilayer multiple perforation embodiment. The features are as described in FIG. 25 with the exception that the single superconducting layer 1000 in FIG. 25 is replaced by a bilayer comprising a normal metal layer 1040 and a superconducting layer 1050.

Figure 28:
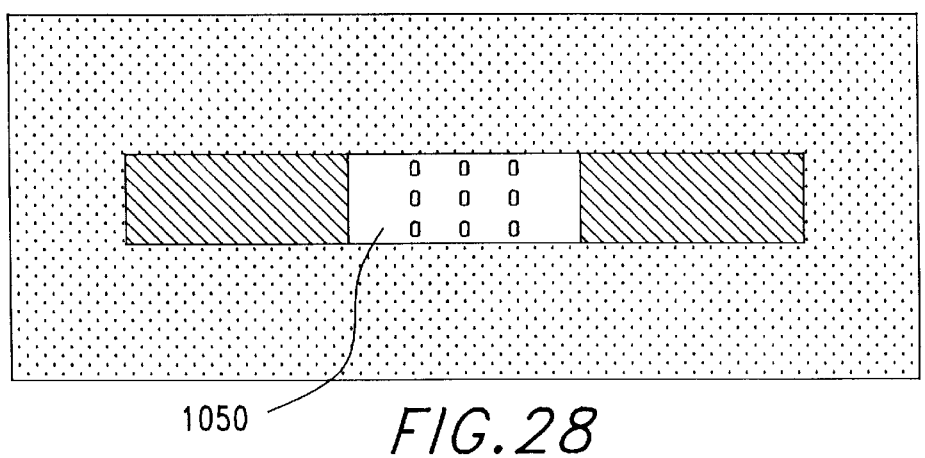
FIG. 28 is a top plan view of the bilayer multiple perforation embodiment.

FIG. 28 is a top plan view of the bilayer multiple perforation embodiment depicted in FIG. 27.

Figure 29:
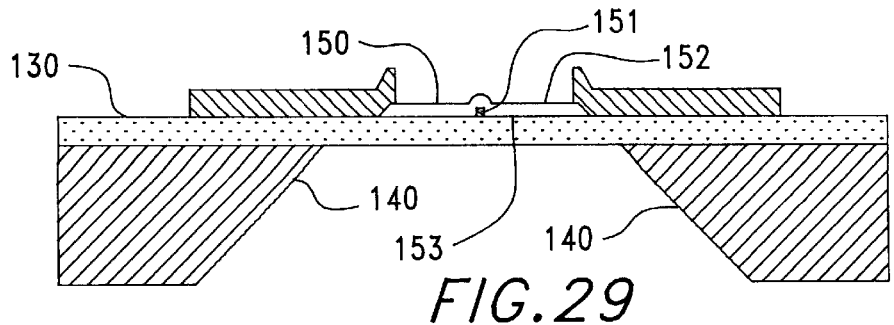
FIG. 29 is a side plan view of a TES with a single layer and a reduced $T_c$ weak link having a normal metal line.

FIG. 29 is a side plan view of a TES with a single layer and normal metal line reduced $T_c$ weak link. In this alternate embodiment, weak links are created by a localized reduction in the critical temperature of the superconducting film 150. This is accomplished with the deposition of a normal metal line 151 on the upper surface 152 or lower surface 153 of the layer 150. The normal metal line may also be deposited upon the substrate 140, resulting in a location between the layer 150 and substrate 140. The reduction in $T_c$ due to the normal metal line 151 is caused by the proximity effect, which is known in the art. FIG. 29 depicts the normal metal line 151 deposited on the lower surface of the layer 150.

Figure 30:
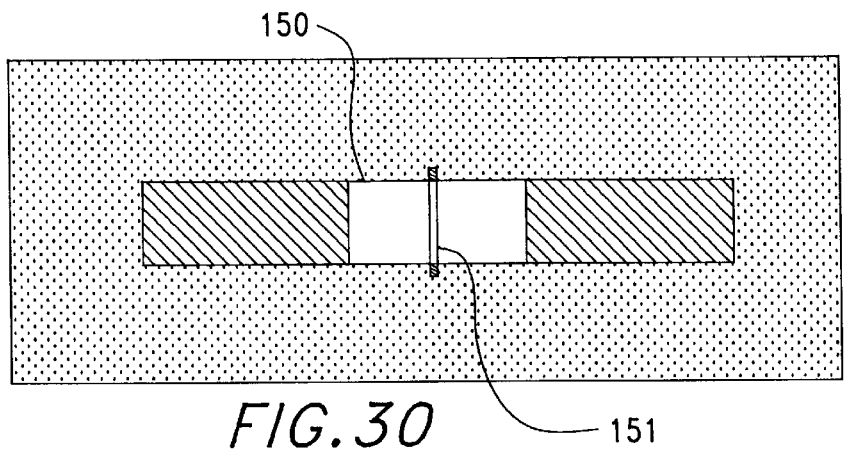
FIG. 30 is a top plan view of a TES with a single layer and a reduced $T_c$ weak link having a normal metal line.

FIG. 30 is a top plan view of a TES having a single layer with a normal metal line reduced $T_c$ weak link normal metal line 151 spanning the width W of layer 150.

Figure 31:
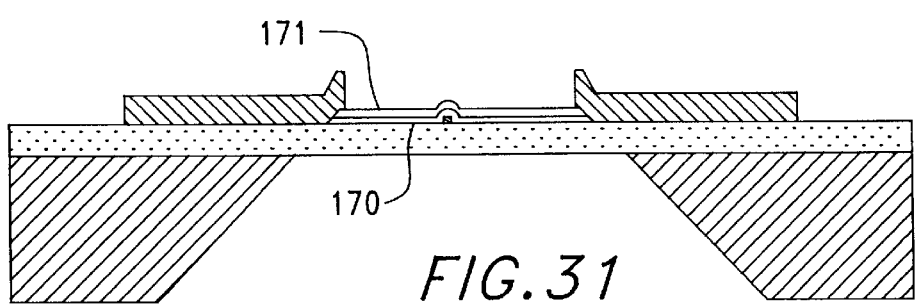
FIG. 31 is a side plan view of a bilayer TES with a normal metal line.

FIG. 31 is a side plan view of a bilayer TES with a normal metal line. The features are as described in FIG. 29 with the exception that the single superconducting layer 150 in FIG. 29 is replaced by a bilayer comprising a normal metal layer 170 and a superconducting layer 171.

Figure 32:
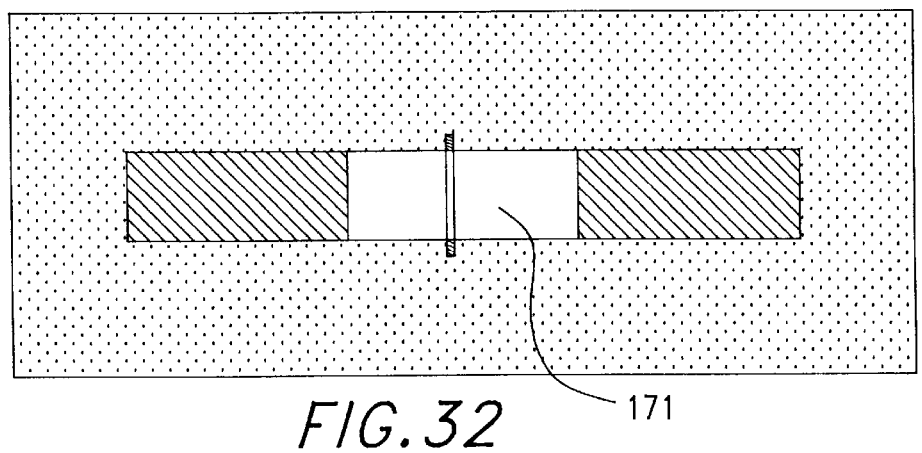
FIG. 32 is a top plan view of a bilayer TES with a normal metal line.

FIG. 32 is a top plan view of a bilayer TES with a normal metal line depicted in FIG. 31.

Figure 33:
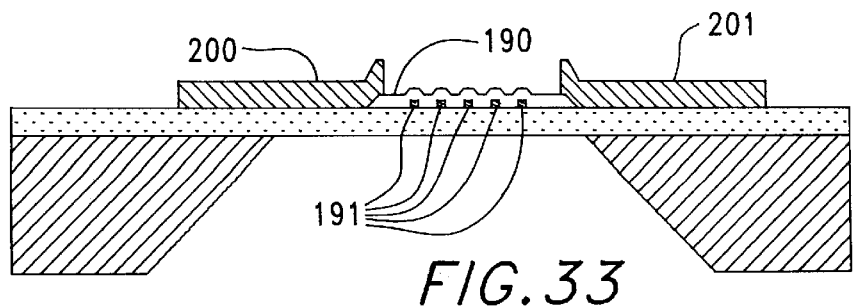
FIG. 33 is a side plan view of a single layer TES with multiple normal metal weak links.

FIG. 33 is a side plan view of a TES with multiple normal metal line weak links. In this alternate embodiment, multiple normal metal line weak links 191 are incorporated into the superconducting layer 190. As shown in FIG. 5, the TES is connected to the rest of the circuit with superconducting links 200 and 201.

Figure 34:
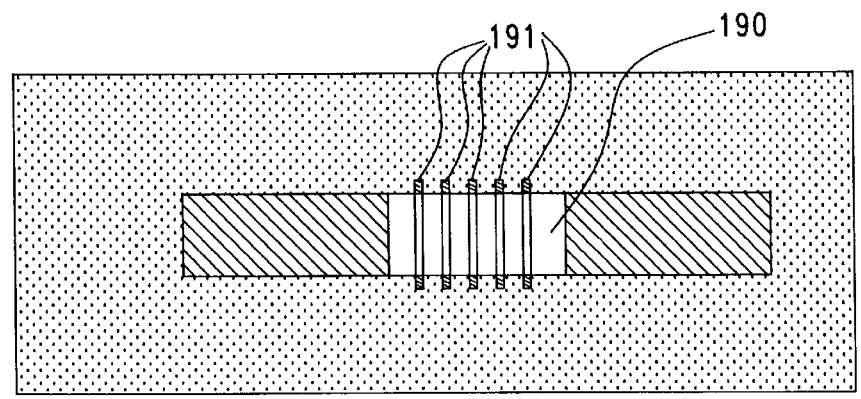
FIG. 34 which is a top plan view of a single layer TES with multiple normal metal line weak links.

Reference is made to FIG. 34 which is a top plan view of a TES with multiple normal metal line weak links 191 as described in FIG. 33.

Figure 35:
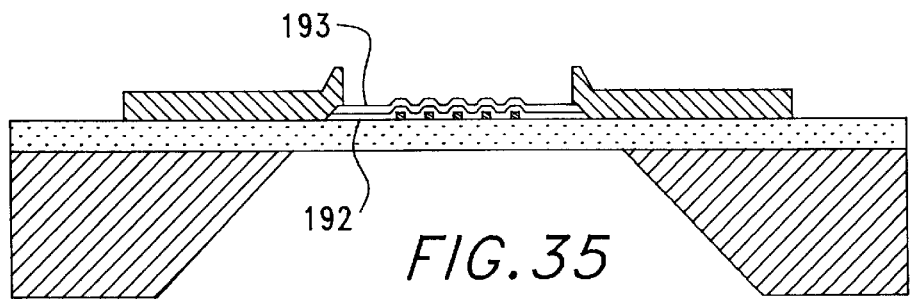
FIG. 35 is a side plan view of a bilayer TES with multiple normal metal line weak links.

FIG. 35 is a side plan view of a bilayer TES with multiple normal metal line weak links. The features are as described in FIG. 33 with the exception that the single superconducting layer 190 in FIG. 33 is replaced by a bilayer comprising a normal metal layer 192 and a superconducting layer 193.

Figure 36:
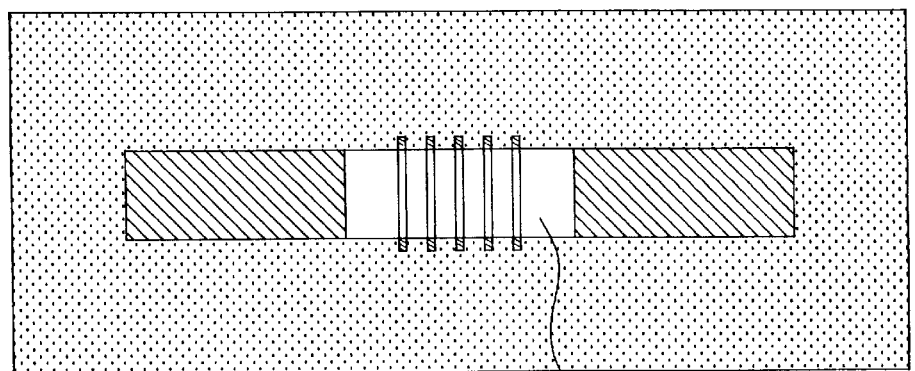
FIG. 36 is a top plan view of a bilayer TES with multiple normal metal line weak links.

FIG. 36 is a top plan view of a bilayer TES with multiple normal metal line weak links depicted in FIG. 35.

Figure 37:
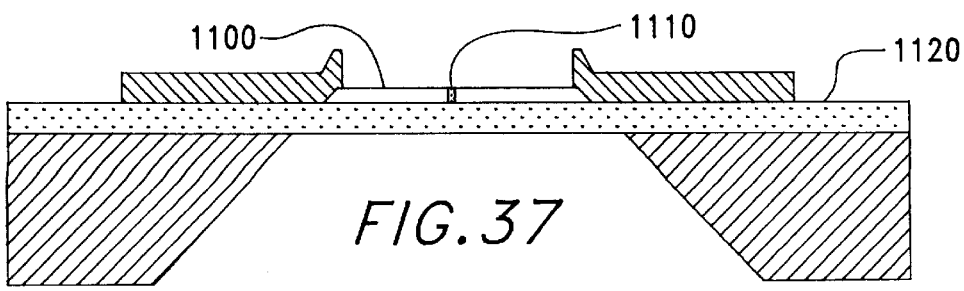
FIG. 37 is a side plan view of a TES having an impurity seam in the superconducting layer.

FIG. 37 is a side plan view of a TES having an impurity seam. Poisoning of the superconducting layer 1100 is achieved with impurities 1110. Superconducting layer 1100 is mounted to substrate 1120. A seam of impurities 1110 is fabricated into layer 1100. The impurities span the entire cross-sectional area of the layer 1100. The impurities may consist of any material, including magnetic materials. The impurities result in reduced conductivity in layer 1100.

Figure 38:
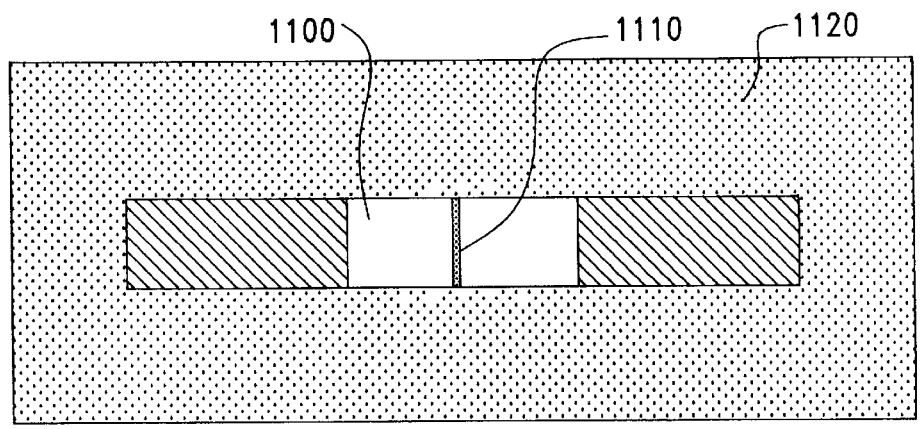
FIG. 38 is a top plan view of a TES having an impurity seam in the superconducting layer.

FIG. 38 is a top plan view of a TES having an impurity seam in the superconducting layer. Superconducting layer 1100 is mounted to substrate 1120. A seam of impurities 1110 are fabricated into layer 1100. The impurities 1110 may consist of any material. The impurities result in areas of reduced conductivity in layer 1100. The area containing the impurities may span the entire width of the layer 1100, or may be adjusted to accommodate the particular needs of an operator.

Figure 39:
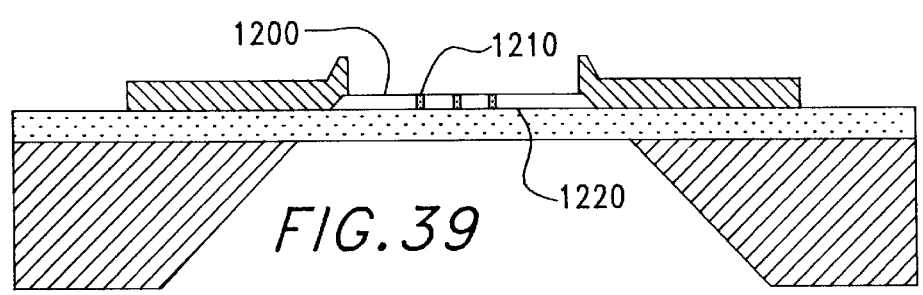
FIG. 39 is a side plan view of a TES having multiple impurity seams in the superconducting layer.

FIG. 39 is a side plan view of a TES having multiple inclusions of impurities in the superconducting layer. Multiple seams of impurities 1210 are fabricated into superconducting layer 1200. The impurities 1210 may consist of any material. The impurities result in reduced areas of conductivity in layer 1200.

Figure 40:
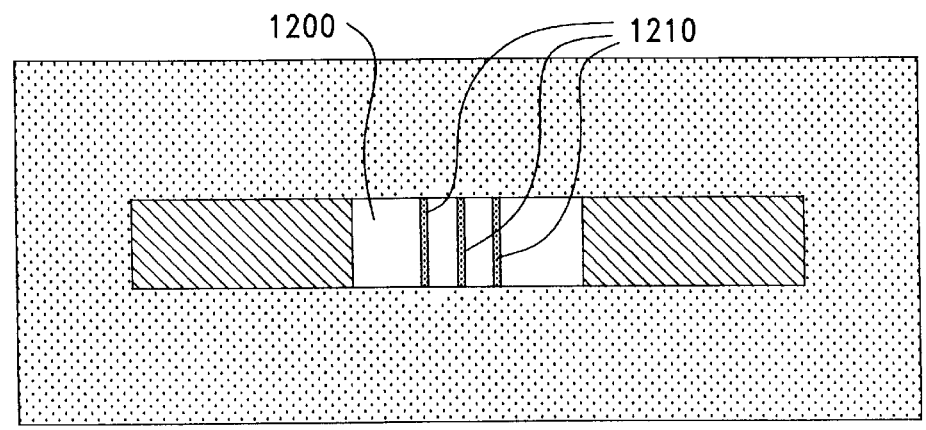
FIG. 40 is a top plan view of a TES having multiple impurity seams in the superconducting layer.

FIG. 40 is a top plan view of a TES having multiple impurity seams in the superconducting layer. Multiple seams of impurities 1210 are arranged across the entire width W of superconducting layer 1200. Any number of seams in any arrangement may be used to achieve the desired effect.

Figure 41:
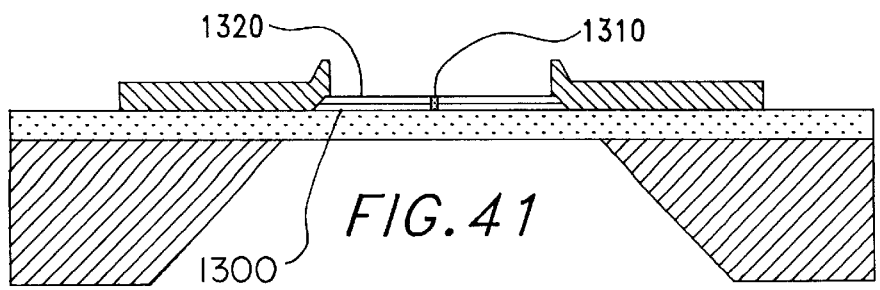
FIG. 41 is a side plan view of a TES having an impurity seam in a bilayer.

FIG. 41 is a side plan view of a TES having an impurity seam in a bilayer. A seam of impurities 1310 is fabricated into normal metal layer 1300 and superconducting layer 1320. The impurities 1310 may consist of any material. The impurities result in reduced conductivity in layer 1300 and/or 1320.

Figure 42:
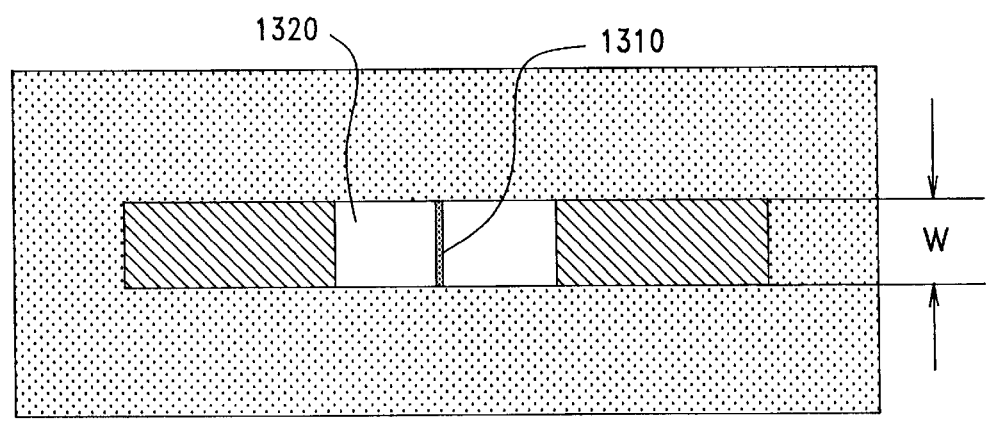
FIG. 42 is a top plan view of a TES having an impurity seam in a bilayer.

FIG. 42 is a top plan view of a TES having an impurity seam in a bilayer. Seams of impurities 1310 completely span the width W of normal metal layer 1300 and superconducting layer 1320.

Figure 43:
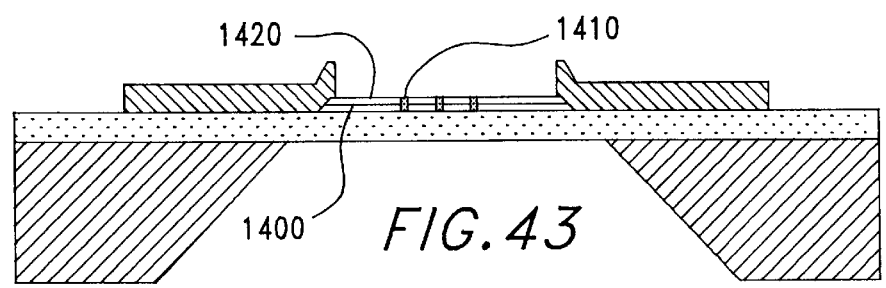
FIG. 43 is a side plan view of a TES having multiple bilayer impurity seams.

FIG. 43 is a side plan view of a TES having multiple bilayer impurity seams. Multiple seams of impurities 1410 are fabricated into normal metal layer 1400 and superconducting layer 1420. The seams of impurities 1410 may consist of any material. The impurities result in reduced conductivity in layer 1400 and 1420.

Figure 44:
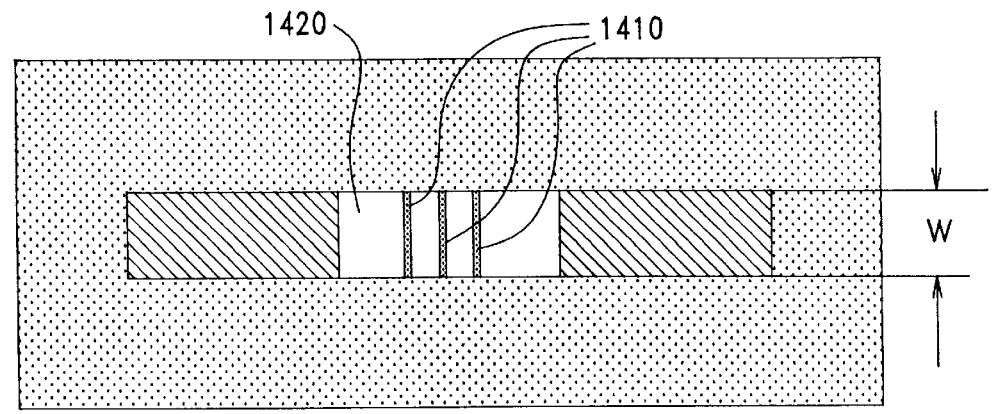
FIG. 44 is a top plan view of a TES having multiple bilayer impurity seams.

FIG. 44 is a top plan view of a TES having multiple bilayer impurity seams. Multiple seams of impurities are fabricated into layer 1400 and 1420. Each seam of impurities completely spans the width W of layer 1400 and 1420.

Figure 45:
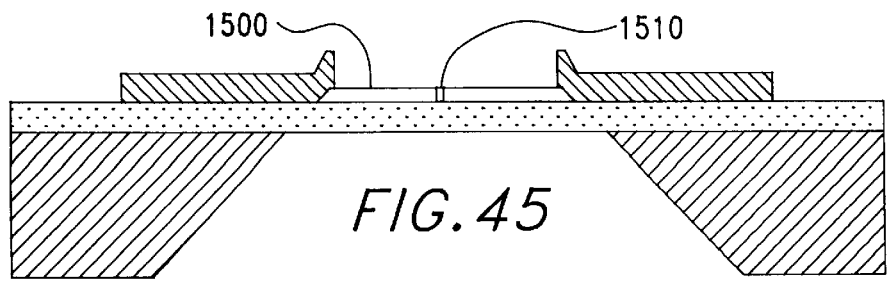
FIG. 45 is a side plan view of a TES having slots.

FIG. 45 is a side plan view of a TES having a single layer having slots. Superconducting layer 1500 is fabricated with cooperating slots 1510. Slots 1510 are fabricated relative to each other so as to result in an area of reduced cross-sectional area 1520 in layer 1500. The fabrication of slots 1510 may be accomplished using photolithographic methods known in the art.

Figure 46:
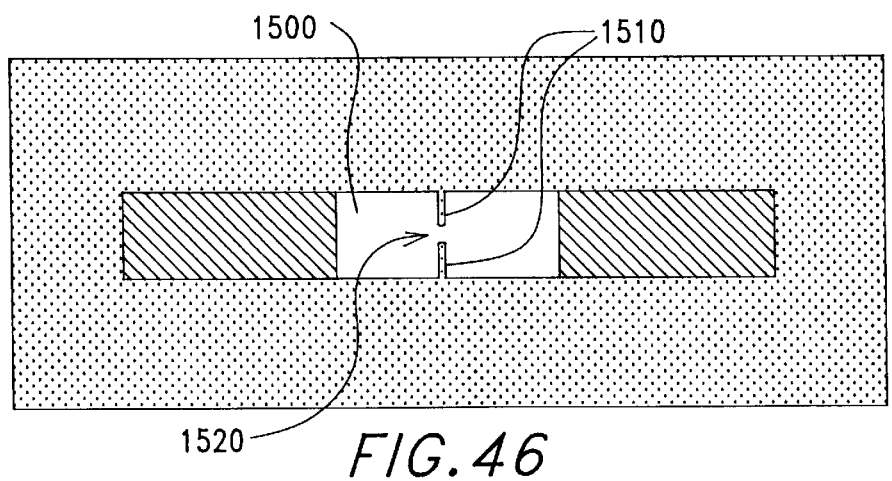
FIG. 46 is a top plan view of a TES having slots.

FIG. 46 is a top plan view of a TES having a single layer having slots. Slots 1510 result in an area of reduced cross section 1520 in layer 1500.

Figure 47:
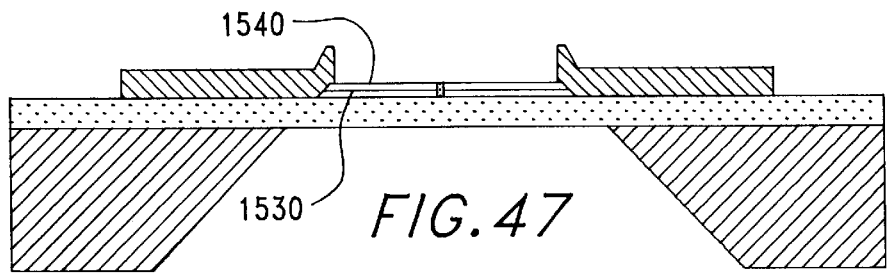
FIG. 47 is a side plan view of a bilayer TES having slots.

FIG. 47 is a side plan view of a bilayer TES having slots. The features are as described in FIG. 45 with the exception that the single superconducting layer 1500 in FIG. 45 is replaced by a bilayer comprising a normal metal layer 1530 and a superconducting layer 1540.

Figure 48:
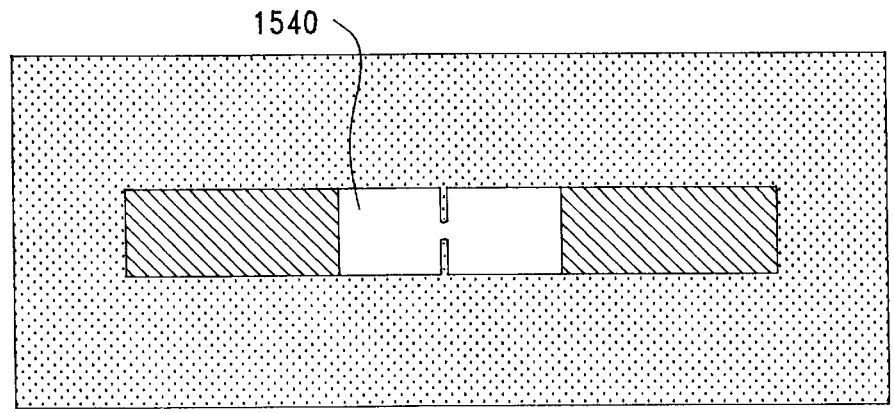
FIG. 48 is a top plan view of a bilayer TES having slots.

FIG. 48 is a top plan view of a bilayer TES having slots. depicted in FIG. 47.

Figure 49:
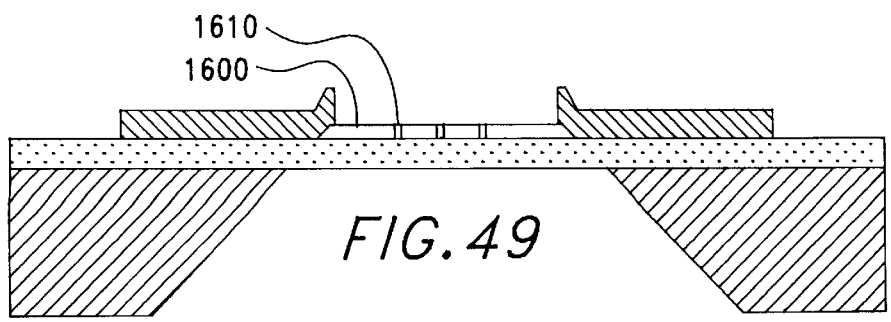
FIG. 49 is a side plan view of a TES having multiple slots.

FIG. 49 is a side plan view of a TES having multiple slots. Superconducting layer 1600 contains slots 1610, each fabricated as described for FIGS. 45 and 46.

Figure 50:
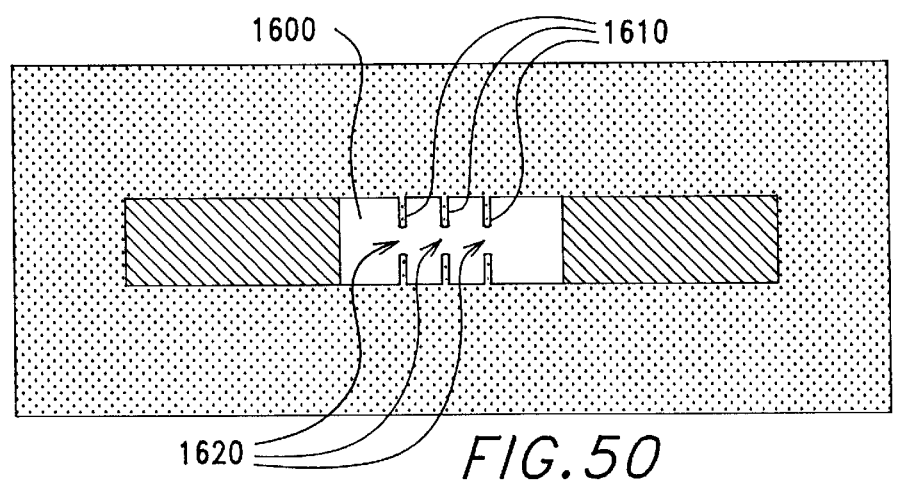
FIG. 50 is a top plan view of a TES having multiple slots.

FIG. 50 is a top plan view of a TES having multiple slots. Superconducting layer 1600 contains cooperating slots 1610. These are fabricated into layer 1600 by using photolithographic methods known in the art. The slots 1610 result in sections of reduced cross-sectional area 1620.

Figure 51:
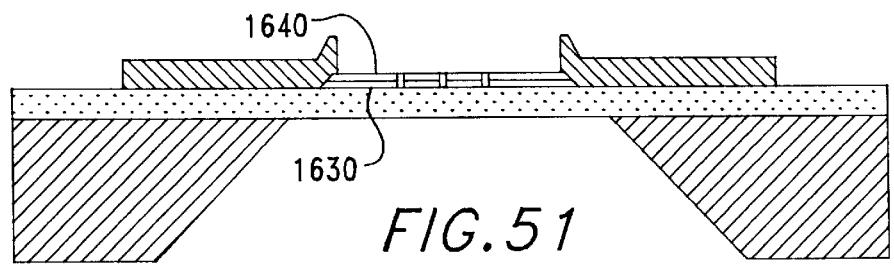
FIG. 51 is a side plan view of a bilayer TES having multiple slots.

FIG. 51 is a side plan view of a bilayer TES having multiple slots. The features are as described in FIG. 49 with the exception that the single superconducting layer 1600 in FIG. 49 is replaced by a bilayer comprising a normal metal layer 1630 and a superconducting layer 1640.

Figure 52:
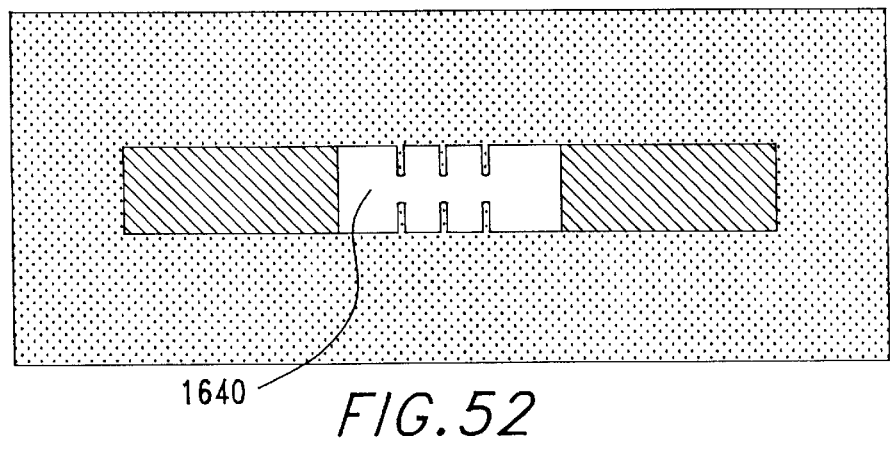
FIG. 52 is a top plan view of a bilayer TES having multiple slots.

FIG. 52 is a top plan view of a bilayer TES having multiple slots as depicted in FIG. 51.

Figure 53:
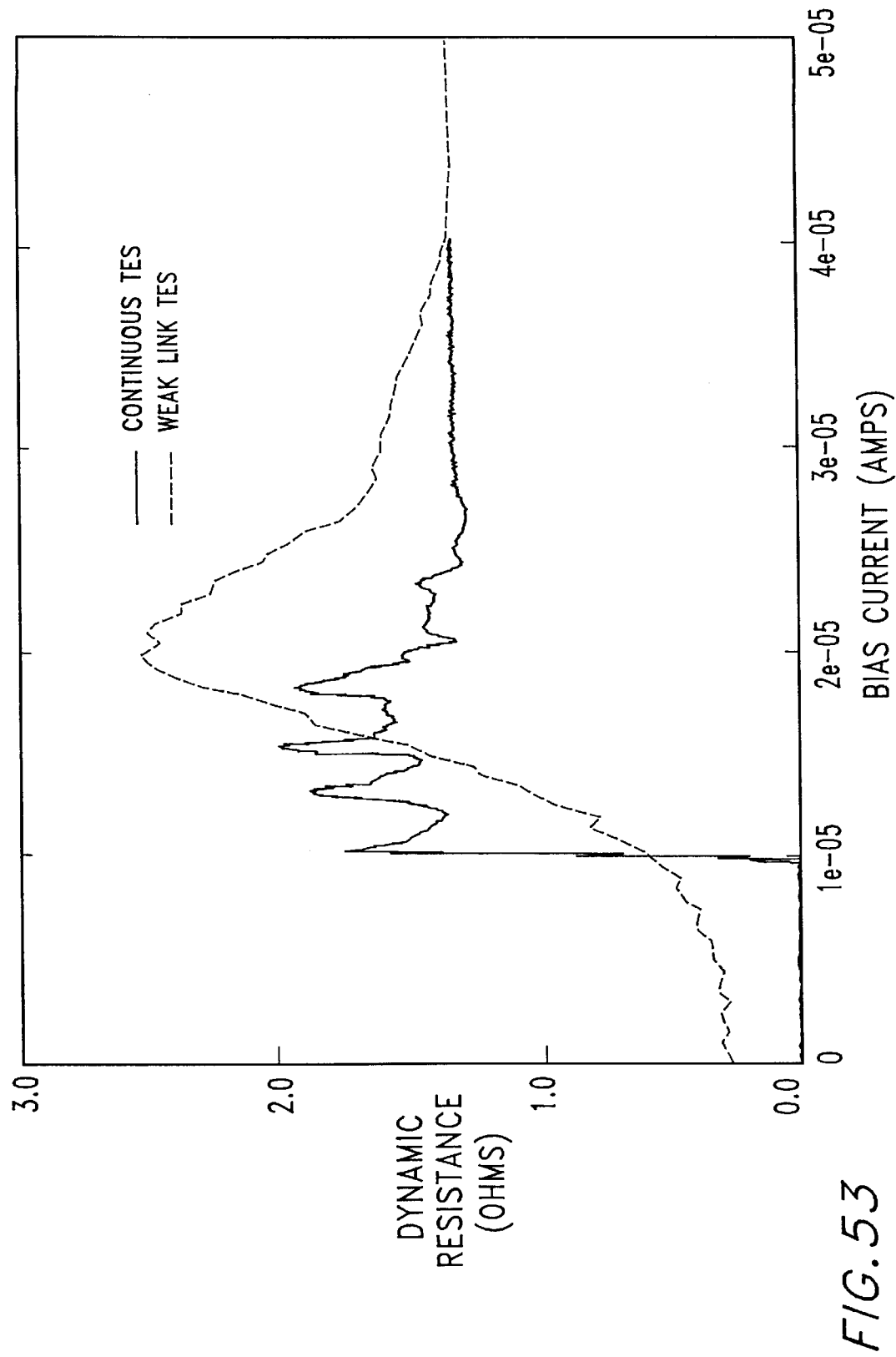
FIG. 53 is a comparison plot of the dynamic resistance versus bias current for a continuous TES and the present invention.

FIG. 53 is a comparison plot of the dynamic resistance versus bias current for a continuous TES and the present invention. The continuous TES has no weak link structure as disclosed for the present invention. The weak link TES response shown is for a step edge weak link. The dynamic resistance of the continuous TES is a rapidly varying function of the bias point for the continuous TES. This behavior, shown as peaks on the graph, is due to phase slip line formation. In the case of the step edge weak link TES, the dynamic resistance varies more smoothly.

Figure 54:
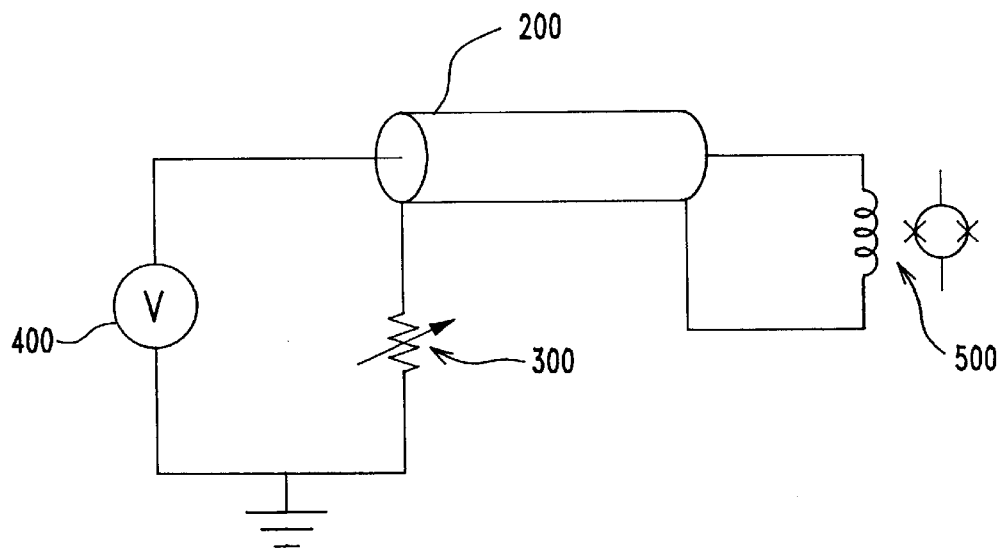
FIG. 54 is a schematic view of an undamped bias circuit.

FIG. 54 is a schematic view of an undamped bias circuit. In the present invention, a voltage source 400 is connected across the TES to create the necessary voltage potential across the TES. The voltage source is typically set at 0.05 to 5.0 $\mu V$. The electrical readout is provided by a SQUID current amplifier 500. The relative inductance of the input coil or SQUID is on the order of $\approx 0.6$ $\mu H$. The SQUID 500 is connected to the TES 300 through long (~0.5 m) superconducting wires 200. The wires can be a twisted pair or a coaxial line, and can be modeled as a transmission line of impedance $Z_{tr}$, which is approximately 50Ω. The twisted conductor pair 200 forms a transmission line with mismatched impedance's. The characteristic impedance of the transmission line is on the order of 50Ω. The resistance of the TES 300, much less than $Z_{tr}$ and is on the order of 0.1Ω. The resonant frequencies of the system are determined by the length of the conductor pair 200. As described previously, high-frequency resonances in the electrical bias circuit of the TES can excite Josephson processes in the TES, leading to voltage steps in the electrical response of the TES. The magnitude between voltage steps are V=hf/2e, where f is the resonant frequency of the bias circuit, and e is the charge of the electron, and h is Planck's constant.

Figure 55:
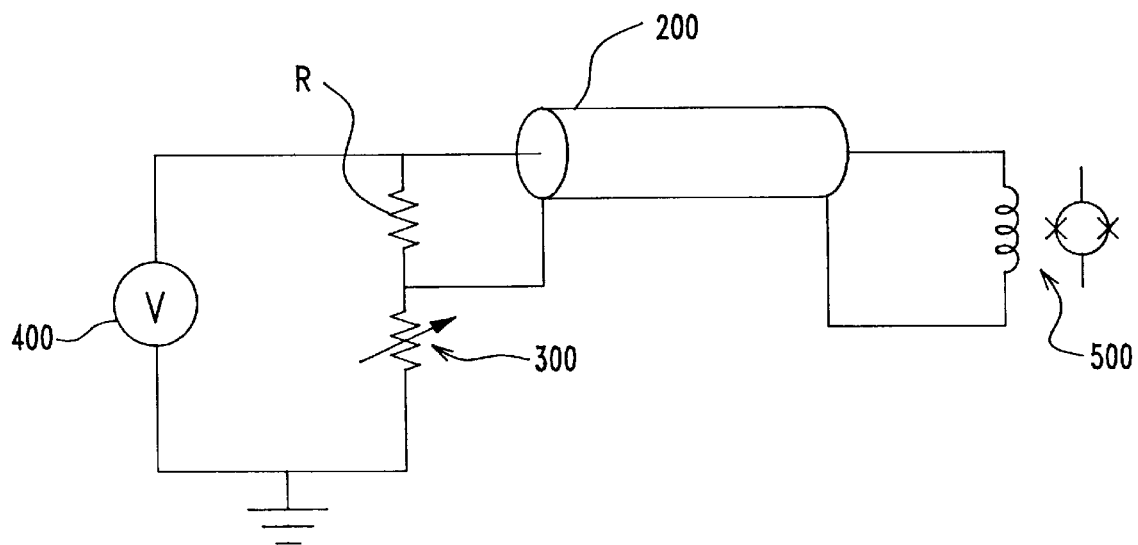
FIG. 55 is a schematic of a damped bias circuit.

FIG. 55 is a schematic of a damped bias circuit. The high-frequency resonance described in FIG. 54 is damped by placing a small resistor R across the conductor pair 200 connected to the SQUID 500. The resistor R has a resistance value on the order of 1Ω. The resistor R damps the bias circuit resonance, giving a smooth I-V relationship without the voltage steps described in FIG. 53.

Although the present invention has been described with reference to preferred embodiments, numerous modifications and variations can be made and still the result will come within the scope of the invention. No limitation with respect to the specific embodiments disclosed herein is intended or should be inferred.

We claim:

1. A superconducting transition edge sensor comprising:
   a substrate;
   a bilayer deposited on said substrate;
   said bilayer comprising a first normal metal layer in contact with a first superconducting layer;
   said bilayer having a localized weak link whereby a predetermined critical current $I_c$ may be maintained;
   said bilayer having a superconducting state, a normal conducting state and a transition region therebetween with a transition temperature $T_c$; and
   a circuit for measuring superconducting transitions within said transition region.

2. The superconducting transition edge sensor as in claim 1, wherein said weak link further comprises a deposition of a normal metal line between said superconducting layer and the substrate.

3. The superconducting transition edge sensor as in claim 2, further comprising a plurality of said normal metal line weak links.

4. The superconducting transition edge sensor as in claim 1, wherein said weak link further comprises an impurity seam at a predetermined location in said superconducting layer.

5. The superconducting transition edge sensor as in claim 4, further comprising a plurality of said impurity seam weak links.

6. The superconducting transition edge sensor as in claim 1, wherein said weak link further comprises a localized thinning of the thickness of the superconducting layer.

7. The superconducting transition edge sensor as in claim 6 further comprising a plurality of said localized thinning weak links.

8. The superconducting transition edge sensor as in claim 1, wherein said weak link further comprises a series of perforations of said superconducting layer.

9. The superconducting transition edge sensor as in claim 8 further comprising a plurality of said perforation weak links.

10. The superconducting transition edge sensor as in claim 1, wherein said weak link further comprises a step edge in said superconducting layer.

11. The superconducting transition edge sensor as in claim 10 further comprising a plurality of said step edge weak links.

12. The superconducting transition edge sensor as in claim 1, wherein said weak link further comprises cooperating slots;
    said slots arranged to result in a reduced width of said superconducting layer.

13. The superconducting transition edge sensor as in claim 12 further comprising a plurality of said cooperating slot weak links.

14. The superconducting transition edge sensor as in claim 1, wherein said weak link further comprises a notch in said superconducting layer;
    said notch traverses the width of said superconducting layer.

15. The superconducting transition edge sensor as in claim 14 further comprising a plurality of said notch weak links.

16. The superconducting transition edge sensor as in claim 1, wherein said circuit for measuring superconducting transitions further comprises:
    a cable having a first conductor and a second conductor; and
    a bias circuit having a resistor electrically connected across said first conductor and said second conductor whereby bias circuit resonance is damped.

17. The superconducting transition edge sensor as in claim 16, wherein said resistor further comprises a resistor having a value in the range of 0.1 ohm to 5 ohm.

18. A superconducting transition edge sensor comprising:
a substrate;
superconducting layer deposited on said substrate, said superconducting layer having a localized weak link whereby a predetermined critical current $I_c$ may be maintained, said superconducting layer having a superconducting state, a normal conducting state and a transition region therebetween with transition temperature $T_c$; and
a circuit connected to the superconducting layer for measuring superconducting transitions within said transition region.

19. The superconducting transition edge sensor as in claim 18, wherein said weak link further comprises a deposition of a normal metal line between said superconducting layer and the substrate.

20. The superconducting transition edge sensor as in claim 19, further comprising a plurality of said normal metal line weak links.

21. The superconducting transition edge sensor as in claim 18, wherein said weak link further comprises an impurity seam at a predetermined location in said superconducting layer.

22. The superconducting transition edge sensor as in claim 21, further comprising a plurality of said impurity seam weak links.

23. The superconducting transition edge sensor as in claim 18, wherein said weak link further comprises a localized thinning of the thickness of the superconducting layer.

24. The superconducting transition edge sensor as in claim 23, further comprising a plurality of said localized thinning weak links.

25. The superconducting transition edge sensor as in claim 18, wherein said weak link further comprises a series of perforations of said superconducting layer.

26. The superconducting transition edge sensor as in claim 25, further comprising a plurality of said perforation weak links.

27. The superconducting transition edge sensor as in claim 18, wherein said weak link further comprises a step edge in said superconducting layer.

28. The superconducting transition edge sensor as in claim 27, further comprising a plurality of said step edge weak links.

29. The superconducting transition edge sensor as in claim 18, wherein said weak link further comprises cooperating slots;
said slots arranged to result in a reduced width of said superconducting layer.

30. The superconducting transition edge sensor as in claim 29, further comprising a plurality of said cooperating slot weak links.

31. The superconducting transition edge sensor as in claim 18, wherein said weak link further comprises a notch in said superconducting layer;
said notch traverses the width of said superconducting layer.

32. The superconducting transition edge sensor as in claim 31, further comprising a plurality of said notch weak links.

33. The superconducting transition edge sensor as in claim 18, wherein said circuit for measuring superconducting transitions further comprises:
a cable having a first conductor and a second conductor; and
a bias circuit having a resistor electrically connected across said first conductor whereby bias circuit resonance is damped.

34. The superconducting transition edge sensor as in claim 33, wherein said resistor further comprises a resistor having a value in the range of 0.1 ohm to 5 ohm.

35. A method for improving the performance of superconducting transition edge sensors comprising the steps of:
depositing a normal-metal superconducting metal bilayer on a substrate;
said bilayer comprising a first normal metal layer in contact with a first superconducting layer;
forming a localized weak link whereby a predetermined critical current $I_c$ may be maintained;
wherein said bilayer has a superconducting state, a normal conducting state and a transition region therebetween with transition temperature $T_c$;
connecting a circuit for measuring superconducting transitions within said transition region;
maintaining a temperature of said bilayer within said transition region;
maintaining a critical current $I_c$ within said transition-edge sensor;
impinging a particle on said bilayer;
measuring a resulting superconducting transition within said transition region;
detecting said particle from said measured superconducting transition; and
reducing a noise signal created by phase slip lines with said weak link thereby eliminating the need to apply a magnetic field.

36. The method for improving the performance of superconducting transition edge sensors as in claim 35 further comprising the steps of:
selecting a cable for said circuit for measuring superconducting transitions having a first conductor and a second conductor;
electrically connecting a resistor across said first conductor and said second conductor.

37. The method for improving the performance of superconducting transition edge sensors as in claim 36 further comprising the step of:
selecting said resistor to have a value in the range of 0.1 ohm to 5 ohm.

38. A method for improving the performance of superconducting transition edge sensors comprising the steps of:
forming a substrate;
forming a layer deposited on said substrate;
said layer comprising a superconducting layer in contact with said substrate;
said layer having a localized weak link whereby a predetermined critical current $I_c$ may be maintained;
said layer having a superconducting state, a normal conducting state and a transition region therebetween with a transition temperature $T_c$;
connecting a means for measuring superconducting transitions within said transition region;
maintaining a temperature of said layer within said transition region;
maintaining a critical current $I_c$ within said transition-edge sensor;
impinging a particle on said layer;
measuring a resulting superconducting transition within said transition region; and
detecting said particle from said measured superconducting transition.

39. The method for improving the performance of superconducting transition edge sensors as in claim 38 further comprising the steps of:

selecting a cable for said circuit for measuring superconducting transitions having a first conductor and a second conductor;

electrically connecting a resistor across said first conductor and said second conductor.

40. The method for improving the performance of superconducting transition edge sensors as in claim 39 further comprising the step of:

selecting said resistor to have a value in the range of 0.1 ohm to 5 ohm.

\* \* \* \* \*